US012793794B2

(12) United States Patent
Zhu et al.

(10) Patent No.: US 12,793,794 B2
(45) Date of Patent: Nov. 10, 2026

(54) MEMORY DEVICES, MEMORY SYSTEMS, AND OPERATION METHODS TO GROUP MEMORY CELLS ACCORDING TO PROGRAM VERIFICATION RESULTS

(71) Applicant: YANGTZE MEMORY TECHNOLOGIES CO., LTD., Wuhan (CN)

(72) Inventors: Zhijiu Zhu, Wuhan (CN); Bo Li, Wuhan (CN); Zhenjia Chen, Wuhan (CN); Yan Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 133 days.

(21) Appl. No.: 18/819,534

(22) Filed: Aug. 29, 2024

(65) Prior Publication Data

US 2026/0066012 A1 Mar. 5, 2026

(30) Foreign Application Priority Data

Aug. 27, 2024 (CN) ......................... 202411190071.2

(51) Int. Cl.

| | |
|---|---|
| ***G11C 16/34*** | (2006.01) |
| ***G11C 5/06*** | (2006.01) |
| ***G11C 16/04*** | (2006.01) |
| ***G11C 16/10*** | (2006.01) |
| ***H10B 41/35*** | (2023.01) |
| ***H10B 41/41*** | (2023.01) |
| ***H10B 43/35*** | (2023.01) |
| ***H10B 43/40*** | (2023.01) |

(52) U.S. Cl.
CPC .............. *G11C 16/34* (2013.01); *G11C 5/063* (2013.01); *G11C 16/0483* (2013.01); *G11C 16/10* (2013.01); *H10B 41/35* (2023.02); *H10B 41/41* (2023.02); *H10B 43/35* (2023.02); *H10B 43/40* (2023.02)

(58) Field of Classification Search
CPC ..... G11C 16/34; G11C 16/0483; G11C 16/10; G11C 5/063; H10B 41/35; H10B 41/41; H10B 43/35; H10B 43/40
See application file for complete search history.

(56) References Cited

U.S. PATENT DOCUMENTS

2019/0392909 A1* 12/2019 Yang ...................... G11C 16/32
2025/0273281 A1* 8/2025 Guan ................. G11C 16/3459

* cited by examiner

*Primary Examiner* — Sultana Begum
(74) *Attorney, Agent, or Firm* — BAYES PLLC

(57) ABSTRACT

In certain aspects, a memory device includes a memory cell array and a peripheral circuit. The memory cell array includes memory cells. The peripheral circuit is configured to program at least a subset of the memory cells by applying a first program voltage to a word line coupled to the subset of the memory cells, and verify the programming of the subset of the memory cells to generate a verify result. The subset of the memory cells include first memory cells that are classified into two or more memory-cell groups based on the verify result. The two or more memory-cell groups are coupled to two or more groups of bit lines, respectively. The peripheral circuit is configured to program the first memory cells by applying a second program voltage to the word line and applying a program-enabled bias voltage to the two or more groups of bit lines in two or more different time durations, respectively.

20 Claims, 17 Drawing Sheets

MEMORY DEVICES, MEMORY SYSTEMS, AND OPERATION METHODS TO GROUP MEMORY CELLS ACCORDING TO PROGRAM VERIFICATION RESULTS

CROSS-REFERENCE TO RELATED APPLICATIONS

This application claims the benefit of priority to Chinese Application No. 202411190071.2, filed on Aug. 27, 2024, which is incorporated herein by reference in its entirety.

BACKGROUND

The present disclosure relates to memory devices, memory systems, and operation methods thereof.

Non-volatile storage devices such as solid-state drives (SSDs), non-volatile memory express (NVMe), embedded multimedia cards (eMMCs), and universal flash storage (UFS) devices, etc., have gained significant popularity in recent years due to their numerous advantages over traditional hard disk drives (HDDs), such as faster read and write speed, durability and reliability, reduced power consumption, silent operation, and smaller form factors. For example, non-volatile storage devices such as SSDs may use NAND Flash memory for non-volatile storage. Various operations can be performed by NAND Flash memory, such as read, program (write), and erase. For NAND Flash memory, an erase operation can be performed at the block level, and a program operation or a read operation can be performed at the page level.

SUMMARY

In one aspect, a memory device is disclosed. The memory device includes a memory cell array including memory cells. The memory device includes a peripheral circuit coupled to the memory cell array. The peripheral circuit is configured to program at least a subset of the memory cells at least by applying a first program voltage to a word line coupled to the subset of the memory cells, and verify the programming of the subset of the memory cells to generate a verify result. The subset of the memory cells include first memory cells that are classified into two or more memory-cell groups based on the verify result. The two or more memory-cell groups are coupled to two or more groups of bit lines, respectively. The peripheral circuit is further configured to program the first memory cells by applying a second program voltage to the word line and applying a program-enabled bias voltage to the two or more groups of bit lines in two or more different time durations, respectively.

In some implementations, for each different memory-cell group coupled to a respective group of bit lines, a respective time duration for the respective group of bit lines is different. The respective time duration includes a period of time between a respective bias start time when the program-enabled bias voltage starts to be applied to the respective group of bit lines and a termination time when the second program voltage terminates to be applied to the word line.

In some implementations, the two or more memory-cell groups include a first memory-cell group including a second memory cell and a second memory-cell group including a third memory cell. A first threshold voltage (Vth) difference between a Vth of the second memory cell and a target Vth of the second memory cell is smaller than a second Vth difference between a Vth of the third memory cell and a target Vth of the third memory cell. A first time duration between a first bias start time and the termination time is smaller than a second time duration between a second bias start time and the termination time. The first bias start time is a time when the program-enabled bias voltage starts to be applied to a first group of bit lines coupled to the first memory-cell group, and the second bias start time is a time when the program-enabled bias voltage starts to be applied to a second group of bit lines coupled to the second memory-cell group.

In some implementations, the Vth of the second memory cell is equal to or greater than a first bias verify voltage corresponding to a target program state of the second memory cell but smaller than the target Vth of the second memory cell. The Vth of the third memory cell is smaller than a first bias verify voltage corresponding to a target program state of the third memory cell and equal to or greater than a second bias verify voltage corresponding to the target program state of the third memory cell.

In some implementations, to program the first memory cells, the peripheral circuit is further configured to apply the second program voltage to the word line from a program-voltage start time to the termination time.

In some implementations, to program the first memory cells, the peripheral circuit is further configured to pre-charge each group of bit lines to a program-inhibit bias voltage before the program-voltage start time, and discharge each group of bit lines to arrive at the program-enabled bias voltage at the respective bias start time.

In some implementations, the memory cells further include a fourth memory cell. A Vth of the fourth memory cell is equal to or greater than a target Vth of the fourth memory cell. To program the first memory cells, the peripheral circuit is further configured to apply a program-inhibit bias voltage to a bit line coupled to the fourth memory cell from the program-voltage start time to the termination time.

In some implementations, the memory device includes a NAND Flash memory device.

In another aspect, a method of operating a memory device is disclosed. The method includes programming at least a subset of memory cells in the memory device at least by applying a first program voltage to a word line coupled to the subset of the memory cells, and verifying the programming of the subset of the memory cells to generate a verify result. The subset of the memory cells include first memory cells that are classified into two or more memory-cell groups based on the verify result, and the two or more memory-cell groups are coupled to two or more groups of bit lines, respectively. The method further includes programming the first memory cells by applying a second program voltage to the word line and applying a program-enabled bias voltage to the two or more groups of bit lines in two or more different time durations, respectively.

In some implementations, for each different memory-cell group coupled to a respective group of bit lines, a respective time duration for the respective group of bit lines is different. The respective time duration includes a period of time between a respective bias start time when the program-enabled bias voltage starts to be applied to the respective group of bit lines and a termination time when the second program voltage terminates to be applied to the word line.

In some implementations, the two or more memory-cell groups include a first memory-cell group including a second memory cell and a second memory-cell group including a third memory cell. A first Vth difference between a Vth of the second memory cell and a target Vth of the second memory cell is smaller than a second Vth difference between a Vth of the third memory cell and a target Vth of the third memory cell. A first time duration between a first bias start time and the termination time is smaller than a second time duration between a second bias start time and the termination time. The first bias start time is a time when the program-enabled bias voltage starts to be applied to a first group of bit lines coupled to the first memory-cell group, and the second bias start time is a time when the program-enabled bias voltage starts to be applied to a second group of bit lines coupled to the second memory-cell group.

In some implementations, the Vth of the second memory cell is equal to or greater than a first bias verify voltage corresponding to a target program state of the second memory cell but smaller than the target Vth of the second memory cell. The Vth of the third memory cell is smaller than a first bias verify voltage corresponding to a target program state of the third memory cell and equal to or greater than a second bias verify voltage corresponding to the target program state of the third memory cell.

In some implementations, programming the first memory cells includes applying the second program voltage to the word line from a program-voltage start time to the termination time.

In some implementations, programming the first memory cells further includes pre-charging each group of bit lines to a program-inhibit bias voltage before the program-voltage start time, and discharging each group of bit lines to arrive at the program-enabled bias voltage at the respective bias start time.

In some implementations, the memory cells further include a fourth memory cell. A Vth of the fourth memory cell is equal to or greater than a target Vth of the fourth memory cell. Programming the first memory cells further includes applying a program-inhibit bias voltage to a bit line coupled to the fourth memory cell from the program-voltage start time to the termination time.

In some implementations, the memory device includes a NAND Flash memory device.

In still another aspect, a system is disclosed. The system includes a memory device and a memory controller coupled to the memory device and configured to control an operation of the memory device. The memory device includes a memory cell array and a peripheral circuit coupled to the memory cell array. The memory cell array includes memory cells. The peripheral circuit is configured to program at least a subset of the memory cells at least by applying a first program voltage to a word line coupled to the subset of the memory cells, and verify the programming of the subset of the memory cells to generate a verify result. The subset of the memory cells include first memory cells that are classified into two or more memory-cell groups based on the verify result, and the two or more memory-cell groups are coupled to two or more groups of bit lines, respectively. The peripheral circuit is further configured to program the first memory cells by applying a second program voltage to the word line and applying a program-enabled bias voltage to the two or more groups of bit lines in two or more different time durations, respectively.

In some implementations, for each different memory-cell group coupled to a respective group of bit lines, a respective time duration for the respective group of bit lines is different. The respective time duration includes a period of time between a respective bias start time when the program-enabled bias voltage starts to be applied to the respective group of bit lines and a termination time when the second program voltage terminates to be applied to the word line.

In some implementations, the two or more memory-cell groups include a first memory-cell group including a second memory cell and a second memory-cell group including a third memory cell. A first Vth difference between a Vth of the second memory cell and a target Vth of the second memory cell is smaller than a second Vth difference between a Vth of the third memory cell and a target Vth of the third memory cell. A first time duration between a first bias start time and the termination time is smaller than a second time duration between a second bias start time and the termination time. The first bias start time is a time when the program-enabled bias voltage starts to be applied to a first group of bit lines coupled to the first memory-cell group, and the second bias start time is a time when the program-enabled bias voltage starts to be applied to a second group of bit lines coupled to the second memory-cell group.

In some implementations, the Vth of the second memory cell is equal to or greater than a first bias verify voltage corresponding to a target program state of the second memory cell but smaller than the target Vth of the second memory cell. The Vth of the third memory cell is smaller than a first bias verify voltage corresponding to a target program state of the third memory cell and equal to or greater than a second bias verify voltage corresponding to the target program state of the third memory cell.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
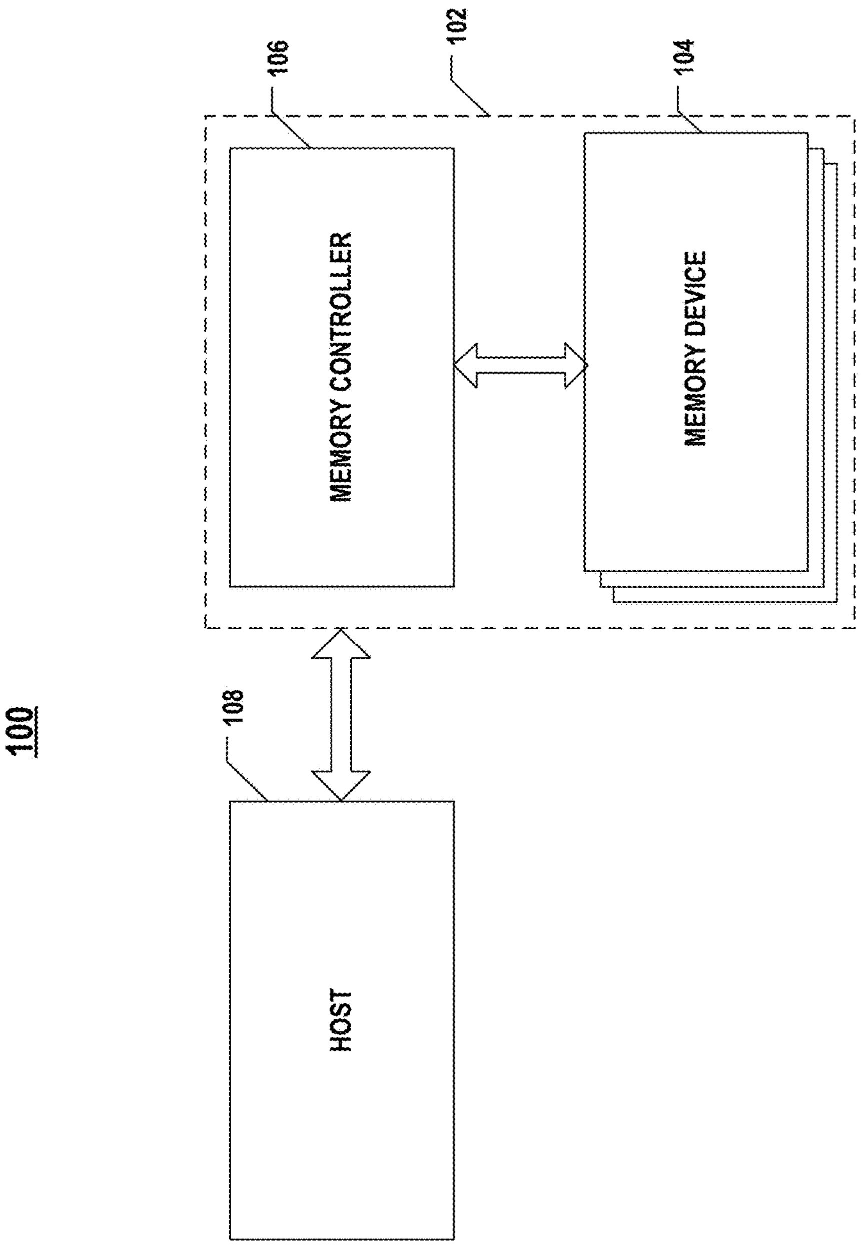
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

To program memory cells in a 3D NAND memory device, a bit line bias scheme (e.g., a 3BL or 4BL bias scheme) can be applied to bias the bit lines coupled to the memory cells with different bias voltages, so that Vth shift step sizes of the memory cells can be controlled to improve the quality of the Vth distributions of the memory cells. A Vth shift step size of a memory cell may be referred to as a Vth increment of the memory cell caused by a program voltage when the program voltage is applied to program the memory cell. For example, the memory cell may be firstly programmed to have a first Vth value when a first program voltage in a first program/verify loop is applied to program the memory cell. Subsequently, the memory cell may be further programmed to have a second Vth value when a second program voltage in a second program/verify loop immediately following the first program/verify loop is applied to program the memory cell. Then, a Vth shift step size of the memory cell caused by the second program voltage is equal to a difference between the first Vth value and the second Vth value (e.g., the Vth shift step size=the second Vth value−the first Vth value). Example implementations of the bit line bias scheme are described below in more detail with reference to FIGS. 6A-6D.

Several issues exist in the bit line bias scheme. For example, the generation and controlling of the different bias voltages (e.g., including a program-enabled bias voltage VSS, a 3BL bias voltage V3*bl*, a 4BL bias voltage V4*bl*, and a program-inhibit bias voltage VDD for the 4BL bias scheme) are relatively complex. An additional charging circuit path (e.g., an additional charging circuit path for generating the 4BL bias voltage) may be needed in each page buffer circuit of the memory device. As a result, the chip area of the page buffer is increased.

In another example, a Vth shift step size of a memory cell can only be reduced for the first program voltage when the bit line bias scheme is applied for the first time. If the programming of the memory cell fails to pass the verification of a target program state of the memory cell (e.g., the Vth of the memory cell is still smaller than a target Vth corresponding to the target program state), the Vth shift step size of the memory cell may restore to a normal step size for subsequent program voltages which are applied after the first program voltage, even though the bit line bias scheme is still applied. The failure to continue reducing the Vth shift step size in the subsequent program voltages may affect the Vth distribution and the program ESUM.

In still another example, the regulating accuracy of the bias voltages generated by a voltage source is relatively limited. In yet another example, the application of the bit line bias scheme may reduce a window of a drain select gate (DSG) select voltage. If the DSG select voltage (Vtsg) does not meet the window condition, the bias voltages may decrease, or a current leakage may occur to an inhibit channel where the program-inhibit bias voltage is applied.

To address one or more of the aforementioned issues, the present disclosure introduces a shift control scheme that can control a Vth shift step size of a memory cell during a program operation more accurately when compared to the bit line bias scheme described above. In the shift control scheme disclosed herein, an effective program duration of a program voltage applied to program the memory cell can be controlled, so that the amount of charge injected into a storage layer of the memory cell through a tunneling current can be controlled more accurately. As a result, the Vth shift step size of the memory cell can be controlled more accurately.

Figure 8A:
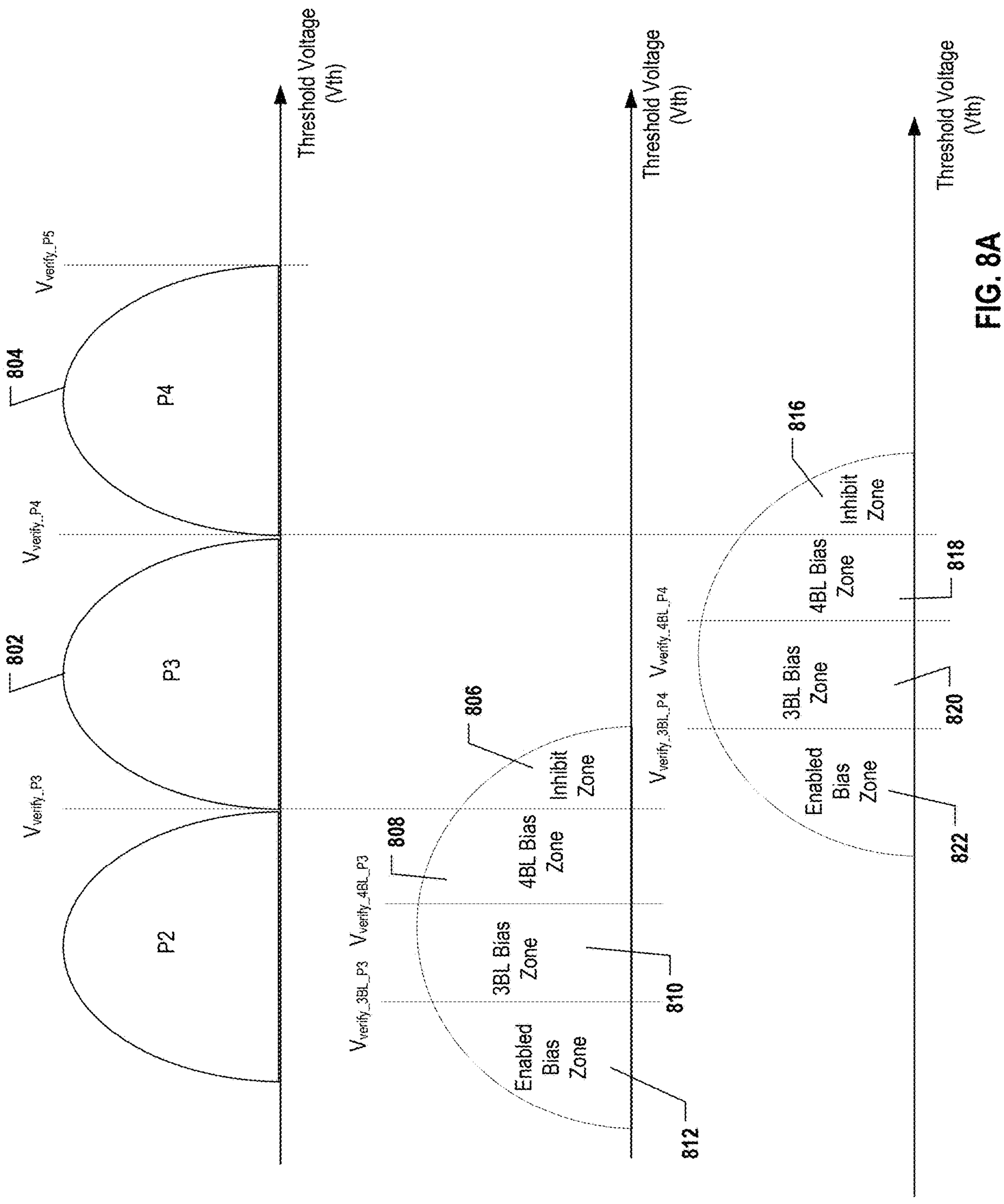
FIG. 8A illustrates a first example of a waveform of word line voltages applied to a word line and waveforms of bit line voltages applied to bit lines, according to some aspects of the present disclosure.
Figure 8B:
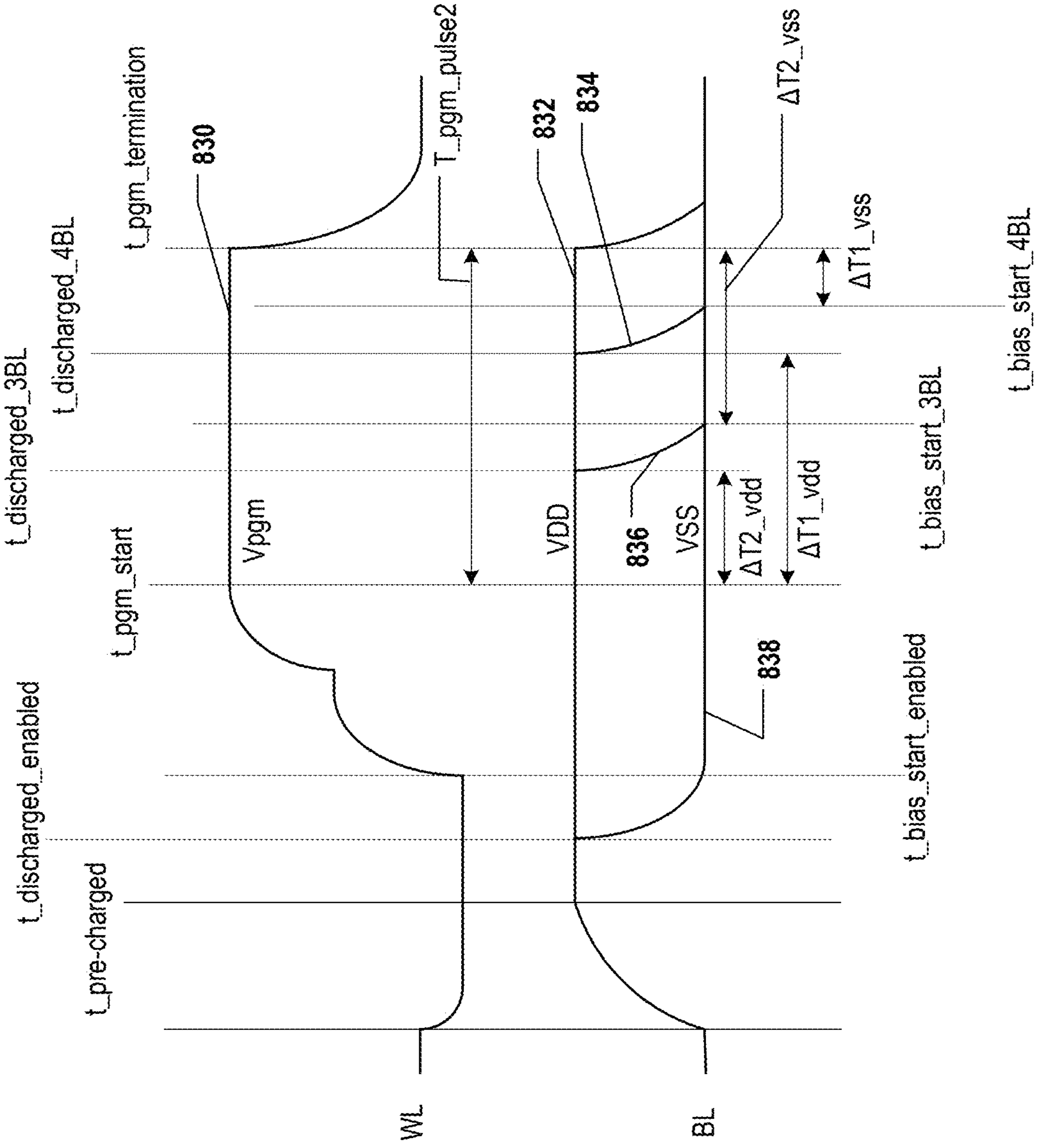
FIG. 8B illustrates a first example of different bias zones for one or more target program states, according to some aspects of the present disclosure.

For example, assume that a first memory cell, a second memory cell, and a third memory cell are coupled to the same word line and are programmed by applying program voltages to the word line. The first memory cell is coupled to a first bit line and configured to be programmed into a first target program state. The second memory cell is coupled to a second bit line and configured to be programmed into a second target program state. The third memory cell is coupled to a third bit line and configured to be programmed into a third target program state. The first, second, and third target program states may be the same program state or different program states. Each of the first, second, and third target program states may be associated with a 4BL bias zone where the 4BL bias voltage V4*bl* is applied to the bit line, a 3BL bias zone where the 3BL bias voltage V3*bl* is applied to the bit line, and an enabled bias zone where the program-enabled bias voltage VSS is applied to the bit line (e.g., as shown in FIGS. 8A-8B below). Assuming that the Vth of the first memory cell is in the 4BL bias zone. The Vth of the second memory cell is in the 3BL bias zone. The Vth of the third memory cell is in the enabled bias zone.

Before applying a program voltage to continue programming the first, second, and third memory cells during a program window (e.g., T_pgm_pulse, from a program-voltage start time to a termination time), the first bit line, the second bit line, and the third bit line are pre-charged to a program-inhibit bias voltage VDD. Then, the third bit line coupled to the third memory cell is discharged to arrive at the program-enabled bias voltage VSS before the program-voltage start time of the program window, such that an effective program duration of the third memory cell is equal to the entire program window. Next, the second bit line coupled to the second memory cell is discharged to arrive at the program-enabled bias voltage VSS at a bias start time to within the program window. An effective program duration of the second memory cell can be obtained as: the effective program duration=the termination time of the program window−the bias start time t0. Subsequently, the first bit line coupled to the first memory cell is discharged to arrive at the program-enabled bias voltage VSS at another bias start time t1 within the program window. The bias start time t1 is after the bias start time t0. An effective program duration of the first memory cell can be obtained as: the effective program duration=the termination time of the program window−the bias start time t1.

Thus, the effective program duration of the third memory cell is greater than the effective program duration of the second memory cell, resulting in a Vth shift step size of the third memory cell being greater than a Vth shift step size of the second memory cell. Similarly, the effective program duration of the second memory cell is greater than the effective program duration of the first memory cell, resulting in the Vth shift step size of the second memory cell being greater than a Vth shift step size of the first memory cell. That is, the third memory cell having a Vth in an enable bias zone has the largest Vth shift step size, and the first memory cell having a Vth in a 4BL bias zone has the smallest Vth shift step size. The Vth shift step size of the second memory cell having a Vth in a 3BL bias zone is between the Vth shift step size of the first memory cell and the Vth shift step size of the third memory cell.

Consistent with some aspects of the present disclosure, by controlling the discharged times to discharge the bit lines coupled to the memory cells from the program-inhibit bias voltage VDD to arrive at the program-enabled bias voltage VSS at different bias start times, the effective program durations of the memory cells can be controlled. Then, the Vth shift step sizes of the memory cells can be controlled through the effective program durations of the memory cells. Thus, improved Vth distributions can be achieved when compared with the bit line bias scheme described above. The program ESUM can also be enhanced. Further, since only the program-enabled bias voltage VDD and the program-inhibit bias voltage VSS are needed in the shift control scheme disclosed herein, no additional charging circuit path for the 4BL bias voltage is required since the 4BL bias voltage is no longer needed. Thus, the chip area of the page buffer can be reduced. A window of the DSG select voltage can also be increased.

FIG. 1 illustrates a block diagram of a system 100 including a memory system 102, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data (a.k.a. user data or host data) to or from memory system 102. Memory system 102 can be a storage product integrating memory controller 106 and one or more memory devices 104, such as an SSD.

Memory devices 104 can be any memory devices disclosed in the present disclosure, including non-volatile memory devices, such as NAND Flash memory devices. In some implementations, memory device 104 also includes one or more volatile memory devices, such as dynamic random-access memory (DRAM) devices or static random-access memory (SRAM) devices.

Memory controller 106 is operatively coupled to memory devices 104 and host 108 and is configured to control memory devices 104, according to some implementations. Memory controller 106 can manage the data stored in memory devices 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment with SSDs or embedded multimedia card (eMMCs) used as data storage for mobile devices, such as smartphones, tablets, laptop computers, etc., and enterprise storage arrays. Memory controller 106 can be configured to control operations of memory devices 104, such as read, program/write, and/or erase operations. Memory controller 106 can also be configured to manage various functions with respect to the data stored or to be stored in memory devices 104 including, but not limited to bad-block management, garbage collection, logical-to-physical (L2P) address conversion, wear-leveling, etc. In some implementations, memory controller 106 is further configured to process error correction codes (ECCs) with respect to the data read from or written to memory devices 104. Any other suitable functions may be performed by memory controller 106 as well, for example, formatting memory devices 104. Memory controller 106 can communicate with an external device (e.g., host 108) according to a particular communication protocol. For example, memory controller 106 may communicate with the external device through at least one of various interface protocols, such as a non-volatile memory express (NVMe) protocol, an NVMe-over-fabrics (NVMe-oF) protocol, a PCI-express (PCI-E) protocol, a universal serial bus (USB) protocol, a multimedia card (MMC) protocol, a peripheral component interconnection (PCI) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
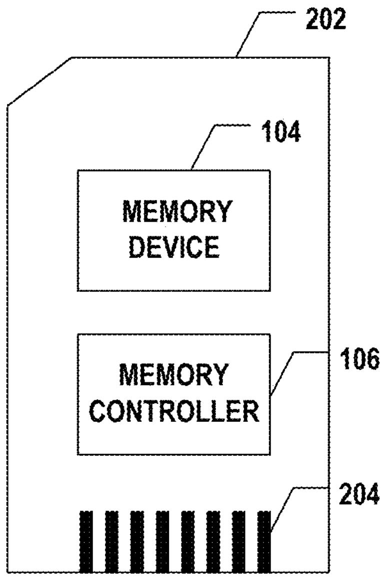
FIG. 2A illustrates a diagram of a memory card having a memory device, according to some aspects of the present disclosure.
Figure 2B:
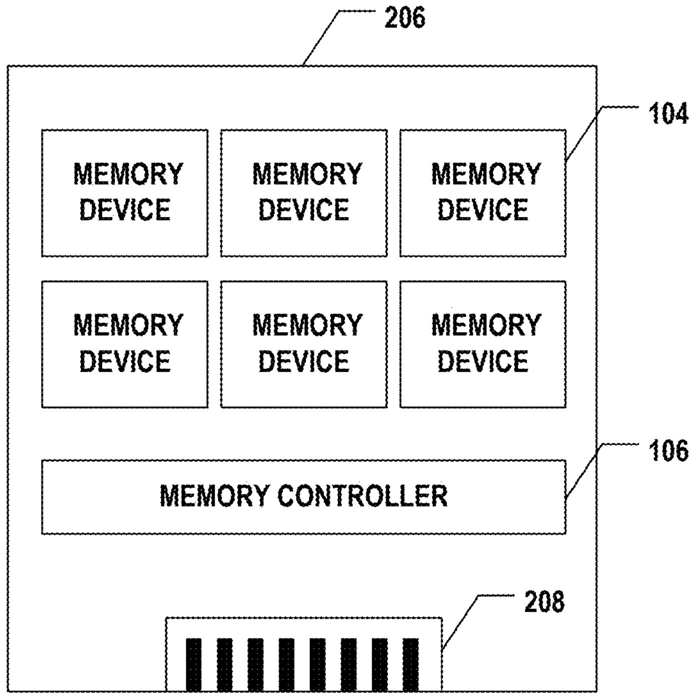
FIG. 2B illustrates a diagram of a solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202. In some implementations, memory system 102 is implemented as an SSD 206 that includes both non-volatile memory devices and volatile memory devices as memory devices 104, such as an enterprise SSD.

Figure 3:
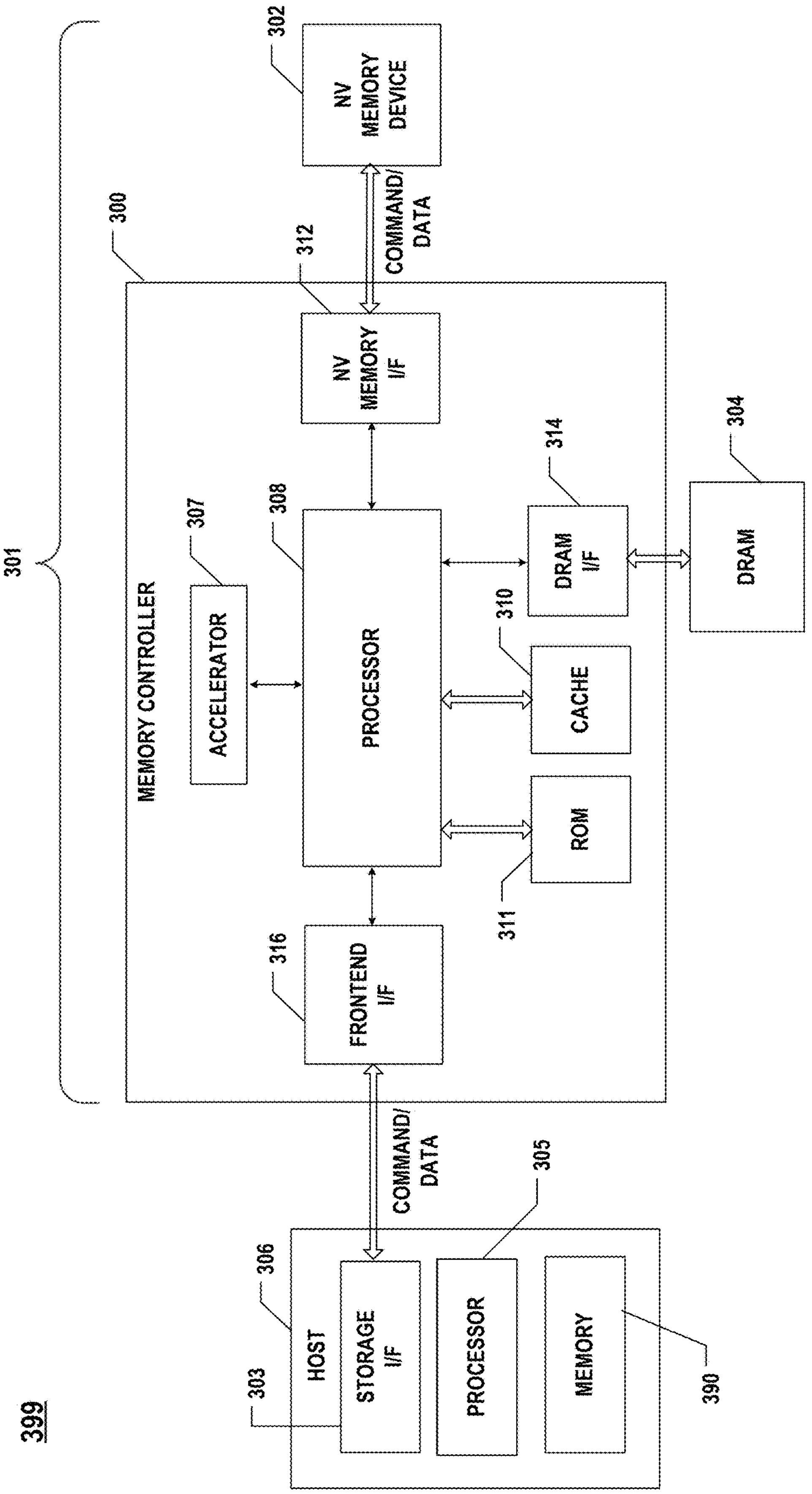
FIG. 3 illustrates another block diagram of a system having a memory device, according to some aspects of the present disclosure.

FIG. 3 illustrates another block diagram of a system 399 having a memory device, according to some aspects of the present disclosure. System 399 may be an example of system 100 in FIG. 1. System 399 may include a host 306 (e.g., an example of host 108 in FIG. 1) and a memory system 301 (e.g., an example of memory system 102 in FIG. 1). Memory system 301 may include a memory controller 300 (e.g., an example of memory controller 106 in FIG. 1) and a non-volatile memory device 302 (e.g., an example of memory device 104 in FIG. 1).

As shown in FIG. 3, memory controller 300 can include a processor 308, an accelerator 307 (e.g., a hardware accelerator), a cache 310, and a read-only memory (ROM) 311. In some implementations, processor 308 is implemented by microprocessors (e.g., digital signal processors (DSPs)) or microcontrollers (a.k.a. microcontroller units (MCUs)) that execute firmware and/or software modules to perform the various functions described herein. The various firmware modules in memory controller 300 described herein can be implemented as firmware codes or instructions stored in ROM 311 and executed by processor 308. In some implementations, processor 308 includes one or more hardware circuits, for example, fixed logic units such as a logic gate, a multiplexer, a flip-flop, a state machine, field-programmable gate arrays (FPGAs), programmable logic devices (PLDs). For example, the hardware circuits may include dedicated circuits performing a given logic function that is known at the time of device manufacture, such as application-specific integrated circuits (ASICs).

As shown in FIG. 3, memory controller 300 can also include various input/output (I/O) interfaces (I/F), such as a non-volatile memory interface 312, a DRAM interface 314, and a frontend interface 316 operatively coupled to non-volatile memory device 302 (e.g., flash memory), DRAM 304 (e.g., an example of volatile memory devices), and host 306, respectively. Non-volatile memory interface 312, DRAM interface 314, and frontend interface 316 can be configured to transfer data, command, clock, or any suitable signals between processor 308 and non-volatile memory device 302, DRAM 304, and host 306, respectively. Non-volatile memory interface 312, DRAM interface 314, and frontend interface 316 can implement any suitable communication protocols facilitating data transfer, communication, and management, such as the NVMe protocol and PCI-E protocol, double data rate (DDR) protocol, to name a few.

As described above, both cache 310 and DRAM 304 may be considered volatile memory devices that can be controlled and accessed by memory controller 300 in a memory system. In some implementations, a cache can be implemented as part of volatile memory devices, for example, by an SRAM and/or DRAM 304. It is understood that although FIG. 3 shows that cache 310 is within memory controller 300, and DRAM 304 is outside of memory controller 300. In some examples, both cache 310 and DRAM 304 may be within memory controller 300 or outside of memory controller 300.

In some implementations, DRAM 304 and DRAM I/F 314 may be optional components of memory system 301. That is, memory system 301 may not include DRAM 304 and DRAM I/F 314 in some examples. For example, memory system 301 may include a UFS device that does not have any DRAM therein.

Host 306 may include a storage interface (I/F) 303, a processor 305, and a memory 390. Storage interface 303 may be operatively coupled to frontend interface 316 of memory controller 300. Storage interface 303 may be configured to transfer data, command, or any suitable signals between host 306 and memory controller 300. Storage interface 303 can implement any suitable communication protocols facilitating data transfer, communication, and management, such as the NVMe protocol, the PCI-E protocol, SCSI, to name a few. Processor 305 may have a structure like that of processor 308, and a similar description will not be repeated herein.

Figure 4:
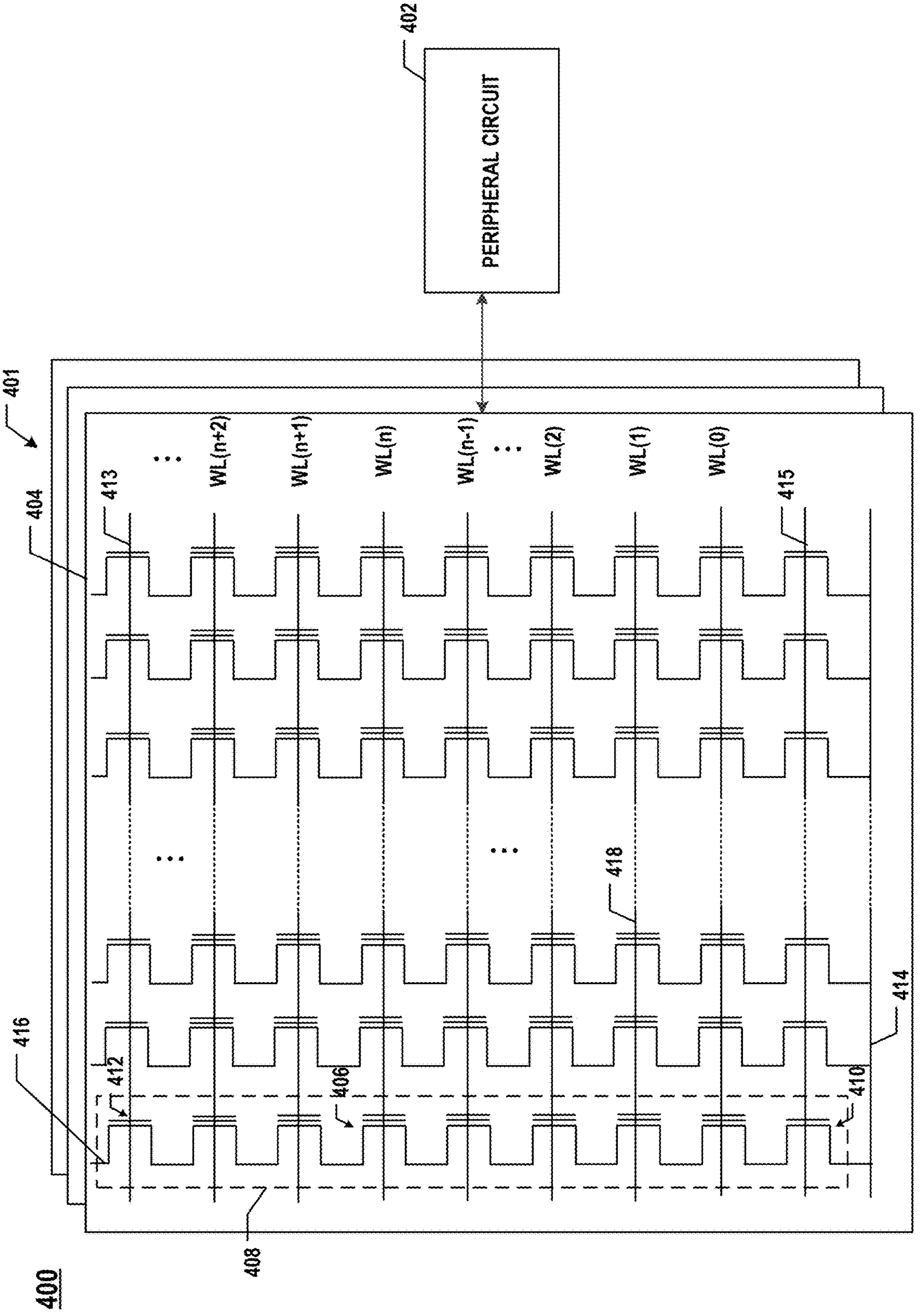
FIG. 4 illustrates a schematic diagram of a memory device including peripheral circuits, according to some aspects of the present disclosure.

FIG. 4 illustrates a schematic diagram of a memory device 400 including peripheral circuits 402, according to some aspects of the present disclosure. Memory device 400 can be an example of memory device 104 in FIG. 1 or non-volatile memory device 302 in FIG. 3. Memory device 400 can include a memory cell array 401 and peripheral circuits 402 coupled to memory cell array 401. Memory cell array 401 can be a NAND Flash memory cell array in which memory cells 406 are provided in an array of NAND memory strings 408 each extending vertically above a substrate (not shown). In some implementations, each NAND memory string 408 includes a plurality of memory cells 406 coupled in series and stacked vertically. Each memory cell 406 can hold a continuous, analog value, such as an electrical voltage or charge, that depends on the number of electrons trapped within a region of memory cell 406. Each memory cell 406 can be either a floating gate type of memory cell including a floating-gate transistor or a charge trap type of memory cell including a charge-trap transistor.

In some implementations, each memory cell 406 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 406 is a multi-level cell (MLC) that is capable of storing more than a single bit of data in more than four memory states. For example, the MLC can store two bits per cell, three bits per cell (also known as TLC), or four bits per cell (also known as QLC). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 4, each NAND memory string 408 can also include a source select gate (SSG) transistor 410 at its source end and a drain select gate (DSG) transistor 412 at its drain end. SSG transistor 410 and DSG transistor 412 can be configured to activate select NAND memory strings 408 (columns of the array) during read and program operations. In some implementations, the sources of NAND memory strings 408 in the same block 404 are coupled through a same source line (SL) 414, e.g., a common SL. In other words, all NAND memory strings 408 in the same block 404 have an array common source (ACS), according to some implementations. The drain of each NAND memory string 408 is coupled to a respective bit line 416 from which data can be read or written via an output bus (not shown), according to some implementations. In some implementations, each NAND memory string 408 is configured to be selected or deselected by applying a DSG select voltage or a DSG unselect voltage to the gate of respective DSG transistor 412 through one or more DSG lines 413 and/or by applying an SSG select voltage or an SSG unselect voltage to the gate of respective SSG transistor 410 through one or more SSG lines 415.

As shown in FIG. 4, NAND memory strings 408 can be organized into multiple blocks 404, each of which can have a common source line 414, e.g., coupled to an ACS. In some implementations, each block 404 is the basic data unit for erase operations, i.e., all memory cells 406 on the same block 404 are erased at the same time. To erase memory cells 406 in a select block 404, source lines 414 coupled to select block 404 as well as unselect blocks 404 in the same plane as select block 404 can be biased with an erase voltage (Vers), such as a high positive voltage (e.g., 20 V or more). Memory cells 406 of adjacent NAND memory strings 408 can be coupled through word lines 418 that select which row of memory cells 406 is affected by read and program operations. Each word line 418 can include a plurality of control gates (gate electrodes) at each memory cell 406 coupled to word line 418 and a gate line coupling the control gates. With reference to FIG. 4, a plurality of word lines WL(0), WL(1), WL(2), . . . , WL(n−1), WL(n), WL(n+1), and WL(n+2) are illustrated, with n being a positive integer.

Figure 5:
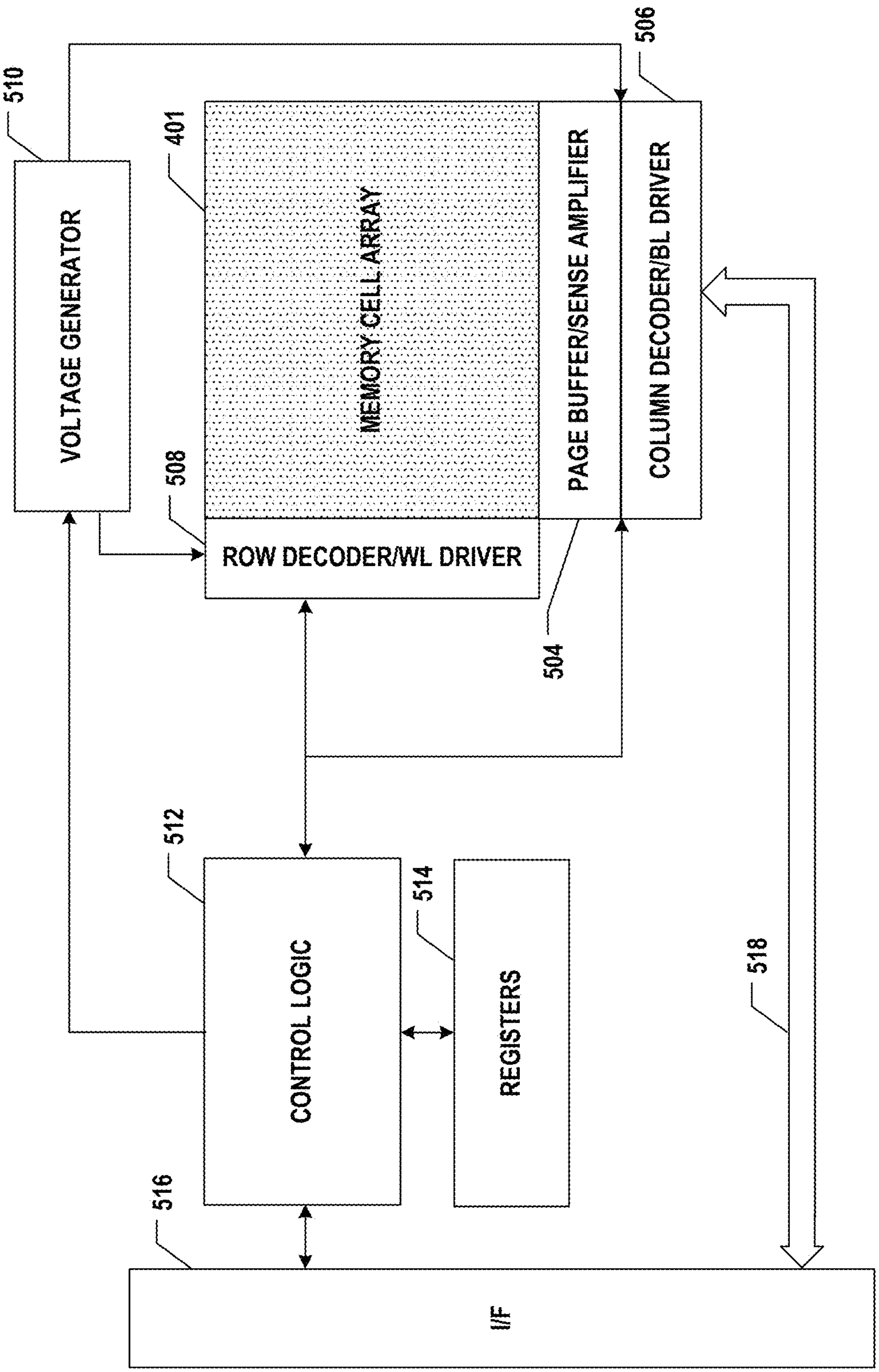
FIG. 5 illustrates a block diagram of a memory device including a memory cell array and peripheral circuits, according to some aspects of the present disclosure.

Peripheral circuits 402 can be coupled to memory cell array 401 through bit lines 416, word lines 418, source lines 414, SSG lines 415, and DSG lines 413. Peripheral circuits 402 can include any suitable analog, digital, and mixed-signal circuits for facilitating the operations of memory cell array 401 by applying and sensing voltage signals and/or current signals to and from each target memory cell 406 through bit lines 416, word lines 418, source lines 414, SSG lines 415, and DSG lines 413. Peripheral circuits 402 can include various types of peripheral circuits formed using metal-oxide-semiconductor (MOS) technologies. For example, FIG. 5 illustrates some peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 401 according to the control signals from control logic 512. In one example, page buffer/sense amplifier 504 may store program data (write data) to be programmed. In another example, page buffer/sense amplifier 504 may verify programmed target memory cells 406 in each program/verify loop (cycle) in a program operation to ensure that the data has been properly programmed into memory cells 406 coupled to select word lines 418. In still another example, page buffer/sense amplifier 504 may also sense the low power signals from bit line 416 that represents a data bit stored in memory cell 406 and amplify the small voltage swing to recognizable logic levels in a read operation. In program operations, page buffer/sense amplifier 504 can include storage modules (e.g., latches, caches, registers, etc.) for temporarily storing a set of N-bits data (e.g., in the form of gray codes) received from data bus 518 and providing the set of N-bits data to a corresponding target memory cell 406 through the corresponding bit line 416 in each program pass of a multi-pass program operation.

Column decoder/bit line driver 506 can be configured to be controlled by control logic 512 and select one or more NAND memory strings 408 by applying bit line voltages generated from voltage generator 510. Row decoder/word line driver 508 can be configured to be controlled by control logic 512 and select/deselect blocks 404 of memory cell array 401 and select/deselect word lines 418 of block 404. Row decoder/word line driver 508 can be further configured to drive word lines 418 using word line voltages generated from voltage generator 510. In some implementations, row decoder/word line driver 508 can also select/deselect and drive SSG lines 415 and DSG lines 413 as well. Voltage generator 510 can be configured to be controlled by control logic 512 and generate the word line voltages (e.g., read voltage, program voltage, channel pass voltage, local voltage, verify voltage, etc.), bit line voltages, and source line voltages to be supplied to memory cell array 401.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a host (e.g., 108 in FIG. 1) to control logic 512 and status information received from control logic 512 to the host. Interface 516 can also be coupled to column decoder/bit line driver 506 via data bus 518 and act as a data input/output (I/O) interface and a data buffer to buffer and relay the data to and from memory cell array 401.

Figure 6A:
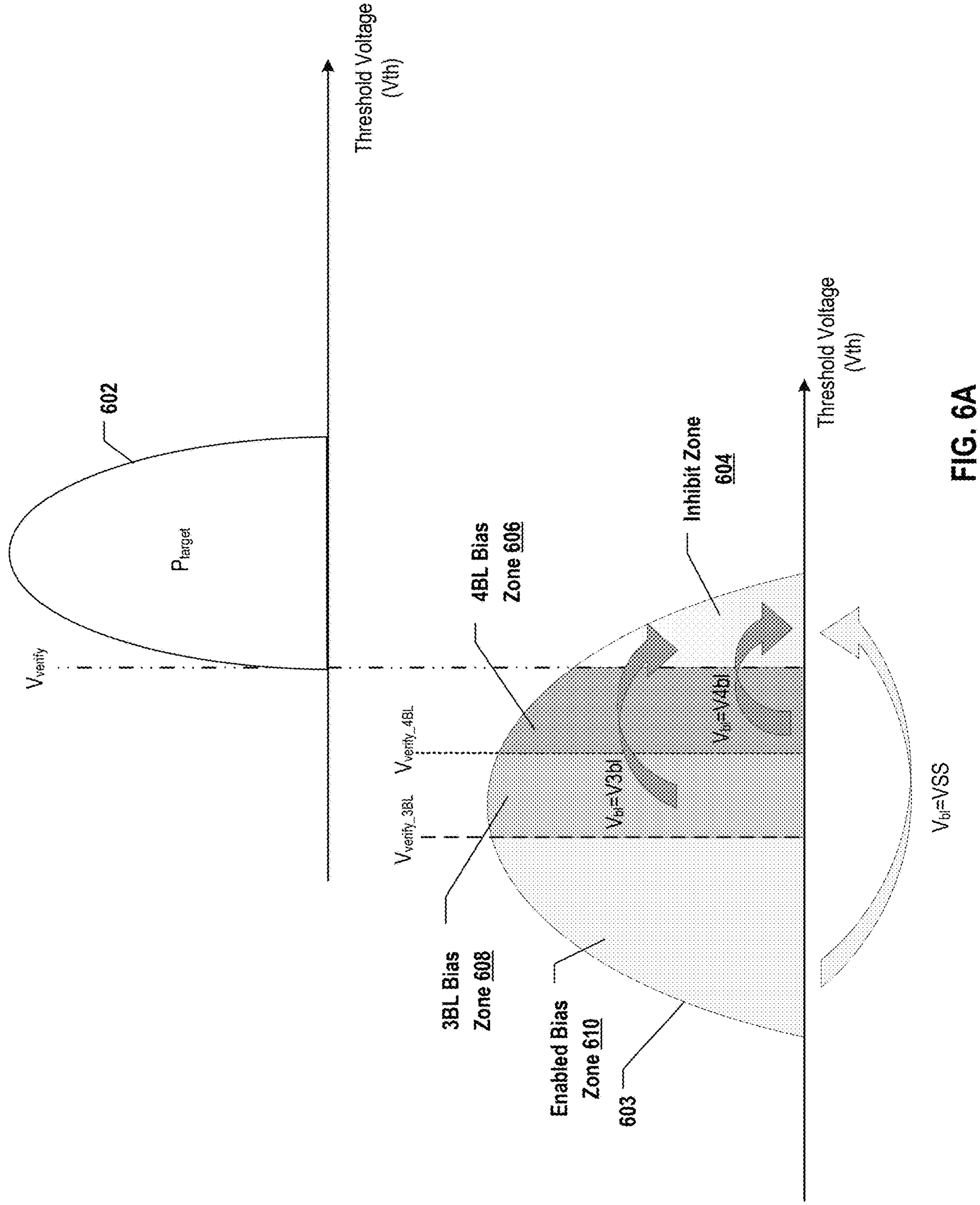
FIGS. 6A-6D illustrate example implementations of a bit line bias scheme, according to some examples of the present disclosure.
Figure 6B:
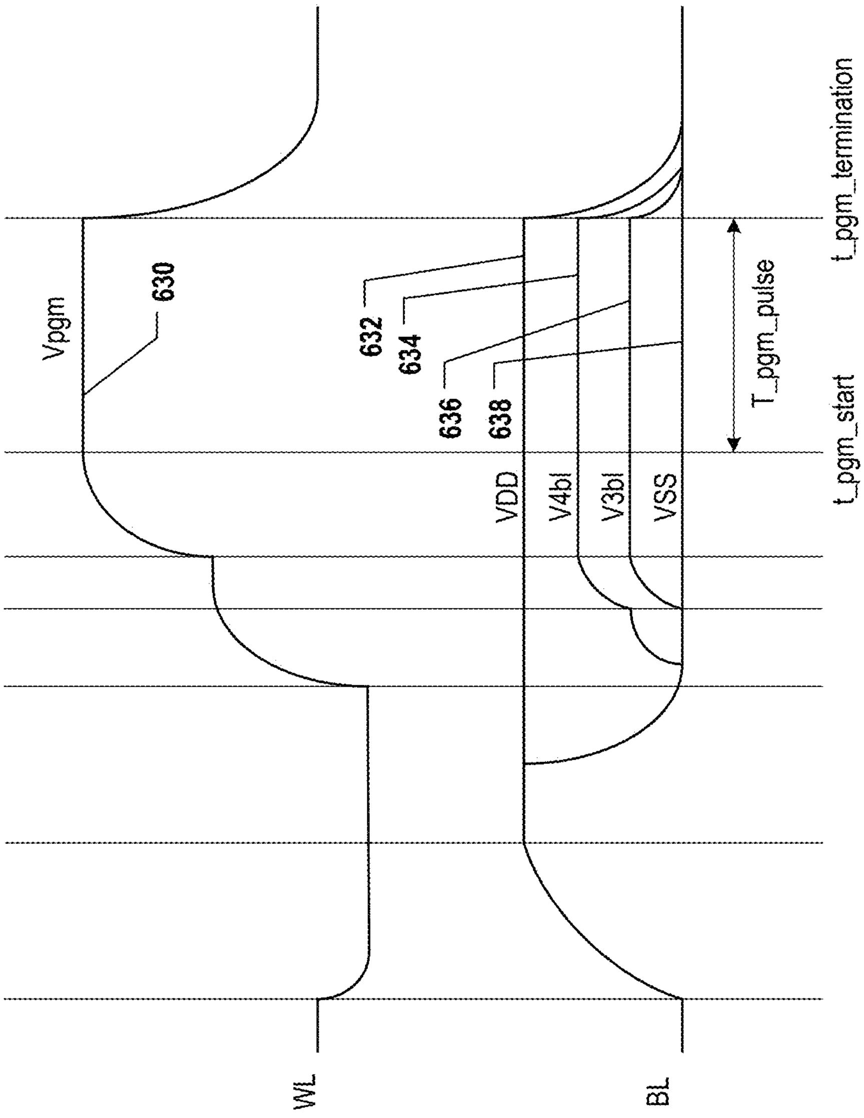

FIGS. 6A-6B illustrate a first example implementation of a bit line bias scheme (e.g., a 4BL bias scheme), according to some examples of the present disclosure. As described above, each memory cell can be configured to store a set of N-bits data in one of $2^N$ Vth ranges of memory cells, where N is an integer greater than 1 (e.g., N=2 for MLCs, N=3 for TLCs, N=4 for QLCs, etc.). Taking QLCs where N=4 for example, each memory cell may either have a Vth in a Vth range corresponding to an erased state P0 or be programmed into one of 15. Vth ranges which correspond to program states P1-P15, respectively. FIG. 6A illustrates a Vth range 602 of memory cells programmed into a target program state $P_{target}$ (e.g., $P_{target}$ can be any one of P1-P15 for QLCs). $V_{verify}$ represents a verify voltage corresponding to the target program state $P_{target}$. Vths of the memory cells programmed into the target program state $P_{target}$ are equal to or greater than $V_{verify}$. In some implementations, the verify voltage $V_{verify}$ corresponding to the target program state $P_{target}$ may also be used as a target Vth of the target program state $P_{target}$. In some other implementations, a Vth within Vth range 602 can be used as the target Vth of the target program state $P_{target}$. For example, a Vth in the middle of Vth range 602 can be used as the target Vth of the target program state $P_{target}$.

During a program operation, a set of memory cells are configured to be programmed into the target program state $P_{target}$. Initially, one or more program/verify loops can be applied to program the set of memory cells, such that the set of memory cells have a Vth distribution 603 as shown in FIG. 6A. Vth distribution 603 can be divided into an inhibit zone 604, a 4BL bias zone 606, a 3BL bias zone 608, and an enabled bias zone 610. The verify voltage $V_{verify}$ can be used to separate (or distinguish) inhibit zone 604 from 4BL bias zone 606. A first bias verify voltage $V_{verify\_4BL}$ can be used to separate (or distinguish) 4BL bias zone 606 from 3BL bias zone 608. A second bias verify voltage $V_{verify\_3BL}$, can be used to separate (or distinguish) 3BL bias zone 608 from enabled bias zone 610.

The set of memory cells may include a first subset of memory cells associated with 4BL bias zone 606. That is, Vths of the first subset of the memory cells are located within 4BL bias zone 606 (e.g., Vths of the first subset of the memory cells are equal to or greater than the first bias verify voltage $V_{verify\_4BL}$ and smaller than the verify voltage $V_{verify}$ of the target program state $P_{target}$). The set of memory cells may further include a second subset of memory cells associated with 3BL bias zone 608. That is, Vths of the second subset of the memory cells are located within 3BL bias zone 608 (e.g., Vths of the second subset of the memory cells are equal to or greater than the second bias verify voltage $V_{verify\_3BL}$ and smaller than the first bias verify voltage $V_{verify\_4BL}$). The set of memory cells may further include a third subset of memory cells associated with enabled bias zone 610. That is, Vths of the third subset of the memory cells are located within enabled bias zone 610 (e.g., Vths of the third subset of the memory cells are smaller than the second bias verify voltage $V_{verify\_3BL}$). The set of memory cells may include a fourth subset of memory cells associated with inhibit zone 604. That is, Vths of the fourth subset of the memory cells are located within inhibit zone 604 (e.g., Vths of the fourth subset of the memory cells are equal to or greater than the verify voltage $V_{verify}$).

In some implementations, the first subset, the second subset, the third subset, and the fourth subset of the memory cells can be determined during a verify stage of one (e.g., the last one) of the one or more program/verify loops. For example, during the verify stage, if it is verified that a Vth of a memory cell is equal to or greater than the first bias verify voltage V verify 4BL and smaller than the verify voltage $V_{verify}$ of the target program state $P_{target}$, then the memory cell is classified into the first subset of the memory cells associated with 4BL bias zone 606. Alternatively, if it is verified that the Vth of the memory cell is equal to or greater than the second bias verify voltage $V_{verify\_3BL}$ and smaller than the first bias verify voltage $V_{verify\_4BL}$, then the memory cell is classified into the second subset of the memory cells associated with 3BL bias zone 608. Alternatively, if it is verified that the Vth of the memory cell is smaller than the second bias verify voltage $V_{verify\_3BL}$, then the memory cell is classified into the third subset of the memory cells associated with enabled bias zone 610. Alternatively, if it is verified that the Vth of the memory cell is equal to or greater than the verify voltage $V_{verify}$, then the memory cell is classified into the fourth subset of the memory cells associated with inhibit zone 604.

In a subsequent program/verify loop following the one or more program/verify loops, four different bias voltages can be applied to bit lines coupled to the four subsets of the memory cells, respectively. Specifically, during a program phase of the subsequent program/verify loop, another program voltage Vpgm can be applied to the word line in a program window T_pgm_pulse from a program start time t_pgm_start to a termination time t_pgm_termination, as shown by a waveform 630 in FIG. 6B. Meanwhile, a first bias voltage (e.g., a 4BL bias voltage V4*bl*) can be applied to bit lines coupled to the first subset of the memory cells associated with 4BL bias zone 606, as shown by a waveform 634 in FIG. 6B; a second bias voltage (e.g., a 3BL bias voltage V3*bl*) can be applied to bit lines coupled to the second subset of the memory cells associated with 3BL bias zone 608, as shown by a waveform 636 in FIG. 6B; and a program-enabled bias voltage (e.g., VSS) can be applied to bit lines coupled to the third subset of the memory cells associated with enabled bias zone 610, as shown by a waveform 638 in FIG. 6B (e.g., VSS<V3*bl*<V4*bl*<VDD).

It is contemplated that a lower bias voltage applied to a bit line coupled to a memory cell can result in a larger Vth shift step size of the memory cell. As a result, Vth shift step sizes of the third subset of the memory cells are greater than Vth shift step sizes of the second subset of the memory cells, and the Vth shift step sizes of the second subset of the memory cells are greater than Vth shift step sizes of the first subset of the memory cells. Since Vths of the fourth subset of the memory cells are already in inhibit zone 604, the program-inhibit bias voltage (e.g., VDD) can be applied to bit lines coupled to the fourth subset of the memory cells to inhibit further programming on the fourth subset of the memory cells, as shown by a waveform 632 in FIG. 6B. That is, Vth shift step sizes of the fourth subset of the memory cells are zero.

Figure 6C:
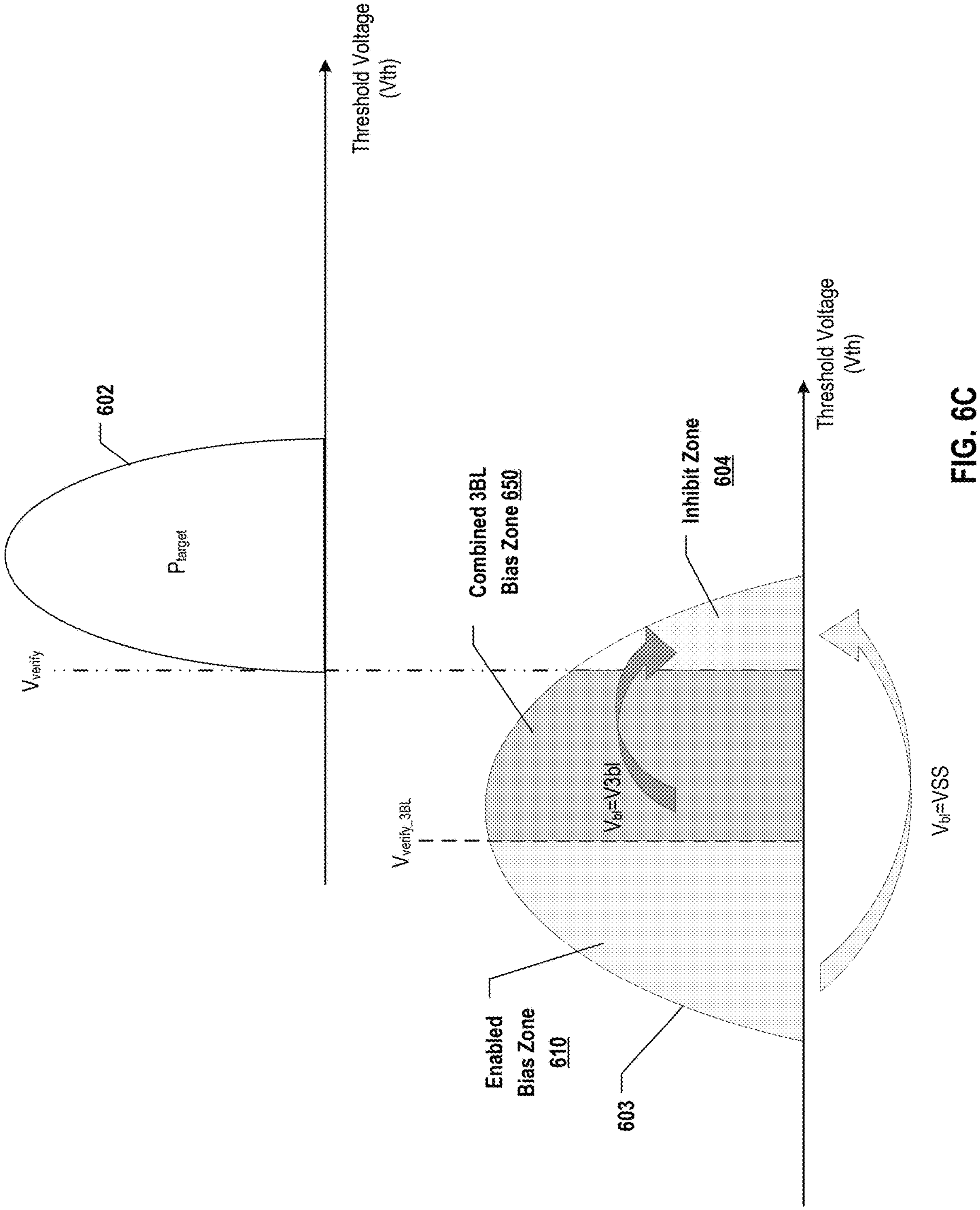
Figure 6D:
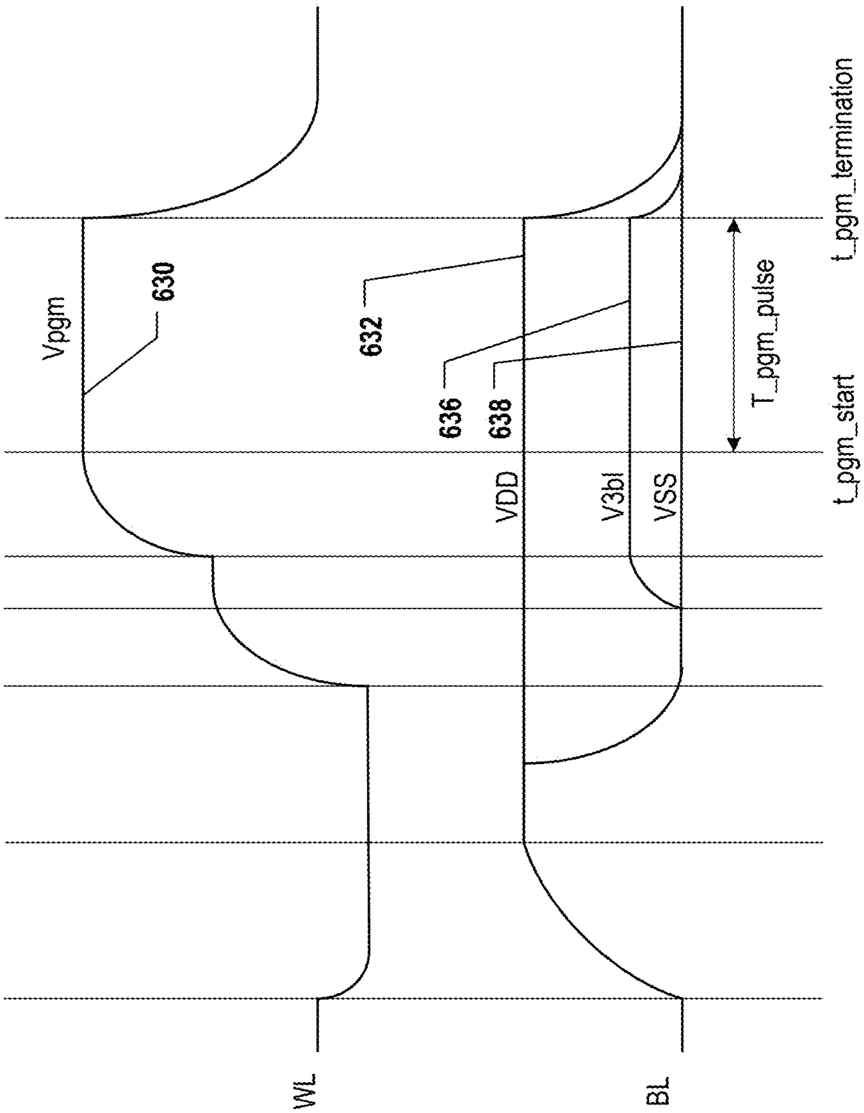

FIGS. 6C-6D illustrate a second example implementation of the bit line bias scheme (e.g., a 3BL bias scheme), according to some examples of the present disclosure. Operations like those described above with reference to FIGS. 6A-6B may be performed, and the similar description will not be repeated herein. Different from the 4BL bias scheme of FIGS. 6A-6B in which Vth distribution 603 is divided into four bias zones, Vth distribution 603 can be divided into three bias zones (e.g., inhibit zone 604, a combined 3BL bias zone 650, and enabled bias zone 610) in the 3BL bias scheme as shown in FIG. 6C.

Combined 3BL bias zone 650 can include 3BL bias zone 608 and 4BL bias zone 606 of FIG. 6A. The first subset of the memory cells having Vths in 4BL bias zone 606 and the second subset of the memory cells having Vths in 3BL bias zone 608 as described above with reference to FIGS. 6A-6B can be combined to form a combined subset of the memory cells having Vths in combined 3BL bias zone 650. That is, the Vths of the combined subset of the memory cells are equal to or greater than the second bias verify voltage $V_{verify\_3BL}$ and smaller than the verify voltage $V_{verify}$.

Rather than applying four different bias voltages to the bit lines coupled to the first, second, third, and fourth subsets of the memory cells, respectively, as described above with reference to FIGS. 6A-6B, three different bias voltages can be applied to bit lines coupled to the combined subset, the third subset, and the fourth subset of the memory cells, respectively, as shown in FIG. 6D. Specifically, during a program phase of a program/verify loop, a program voltage Vpgm can be applied to the word line in a program window T_pgm_pulse from a program start time t_pgm_start to a termination time t_pgm_termination, as shown by waveform 630 in FIG. 6D. Meanwhile, the second bias voltage (e.g., the 3BL bias voltage V3*bl*) can be applied to bit lines coupled to the combined subset of the memory cells having the Vths in combined 3BL bias zone 650, as shown by waveform 636 in FIG. 6D. The program-enabled bias voltage (e.g., VSS) can be applied to the bit lines coupled to the third subset of the memory cells having the Vths in enabled bias zone 610, as shown by waveform 638 in FIG. 6D.

As a result, Vth shift step sizes of the third subset of the memory cells are greater than Vth shift step sizes of the combined subset of the memory cells. Since the Vths of the fourth subset of the memory cells are already in inhibit zone 604, the program-inhibit bias voltage (e.g., VDD) can be applied to the bit lines coupled to the fourth subset of the memory cells to inhibit further programming of the fourth subset of the memory cells, as shown by waveform 632 in FIG. 6D. That is, the Vth shift step sizes of the fourth subset of the memory cells are zero.

With reference to FIGS. 6A-6D, different bias voltages can be applied to the bit lines coupled to the different subsets of the memory cells so that the different subsets of the memory cells are controlled to have different Vth shift step sizes. However, as described above, some issues exist in the bit line bias scheme illustrated in FIGS. 6A-6D. For example, the controlling of the different bias voltages is relatively complex. An additional charging circuit path (e.g., an additional charging circuit path for generating the 4BL bias voltage) may be needed in each page buffer circuit of the memory device. As a result, the chip area of the page buffer is increased.

In another example, a Vth shift step size of a memory cell can only be reduced for a program voltage when the bit line bias scheme is applied for the first time. If the programming of the memory cell by the program voltage fails to pass the verification of the target program state of the memory cell, the Vth shift step size of the memory cell may become larger (e.g., restored to a normal step size) for subsequent program voltages applied after the program voltage, even though the bit line bias scheme is still applied for the subsequent program voltages. As a result, the Vth distribution and the program ESUM are affected.

In still another example, the regulating accuracy of the bias voltages generated by a voltage source is relatively limited. In yet another example, the application of the bit line bias scheme may reduce a window of a DSG select voltage. If the DSG select voltage (Vtsg) does not meet the window condition, the bias voltages may decrease, or a current leakage may occur to an inhibit channel where the program-inhibit bias voltage is applied.

Figure 7:
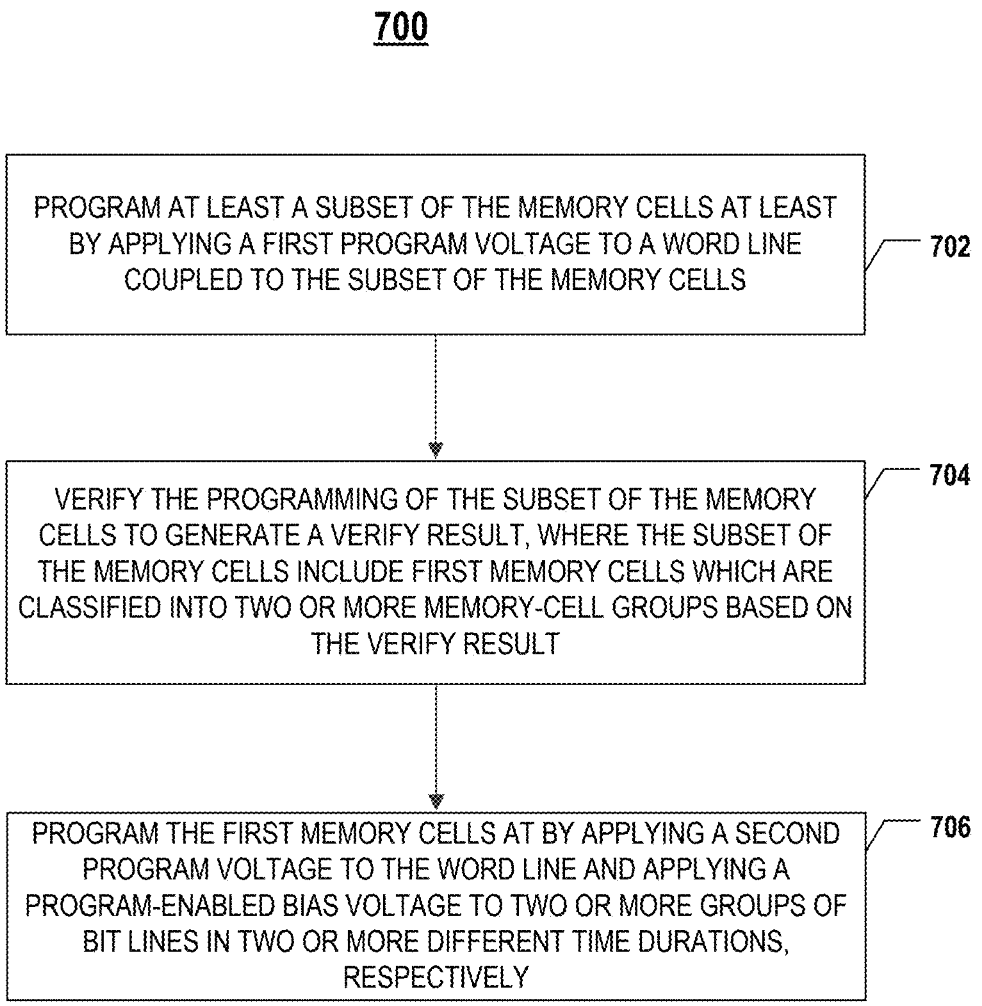
FIG. 7 illustrates a flowchart of a method for operating a memory device, according to some aspects of the present disclosure.

Consistent with some aspects of the present disclosure, the shift control scheme disclosed herein can address one or more of the above-mentioned issues related to the bit line bias scheme. FIG. 7 illustrates a flowchart of a method 700 for operating a memory device, according to some examples of the present disclosure. Method 700 can be an example implementation of the shift control scheme disclosed herein. Method 700 may be performed by a peripheral circuit (e.g., peripheral circuit 402) of the memory device. It is understood that the operations shown in method 700 may not be exhaustive and that other operations can be performed as well before, after, or between any of the illustrated operations. Further, some of the operations may be performed simultaneously, or in a different order than shown in FIG. 7.

The memory device of FIG. 7 can be any memory device disclosed herein, such as memory device 104 of FIG. 1, memory device 302 of FIG. 3, or memory device 400 of FIG. 4. For example, the memory device may be a NAND Flash memory device. The memory device may include a memory cell array (e.g., memory cell array 401) including memory cells. The memory device may also include the peripheral circuit which is coupled to the memory cell array and configured to perform method 700. In some implementations, incremental step pulse programming (ISPP) can be applied to program the memory cells.

Method 700 may begin with operation 702 in which at least a subset of the memory cells coupled to a word line may be programmed by applying a first program voltage to the word line. The subset of the memory cells may be configured to be programmed into a set of target program states, respectively. The set of target program states can be the same program state or different program states, which is not limited herein.

In some implementations, a program-enabled bias voltage (e.g., VSS) may be applied to bit lines coupled to the subset of the memory cells when the first program voltage is applied to the word line. For example, assuming that Vths of the subset of the memory cells are smaller than the second bias verify voltages associated with their respective target program states (e.g., $V_{verify\_3BL}$ shown in FIG. 6A or 6C). The first program voltage may be applied to the word line during a first program window (e.g., from a first program-voltage start time to a first termination time), like waveform 630 shown in FIG. 6B. Before the first program-voltage start time, the program-enabled bias voltage may be applied to the bit lines coupled to the subset of the memory cells, like waveform 638 shown in FIG. 6B. As a result, an effective program duration of the first subset of the memory cells is equal to the entire first program window.

In some implementations, each target program state may be associated with a 4BL bias zone, a 3BL bias zone, an enabled bias zone, and an inhibit zone, like that shown in FIG. 6A or in FIG. 8A. For example, FIG. 8A illustrates a Vth range 802 of memory cells programmed into a target program state P3 and a Vth range 804 of memory cells programmed into a target program state P4. $V_{verify\_P3}$ represents a verify voltage corresponding to the target program state P3. $V_{verify\_P4}$ represents a verify voltage corresponding to the target program state P4. Vths of the memory cells programmed into the target program state P3 are equal to or greater than $V_{verify\_P3}$ and smaller than $V_{verify\_P4}$. Vths of the memory cells programmed into the target program state P4 are equal to or greater than $V_{verify\_P4}$ and smaller than a verify voltage $V_{verify\_P5}$ corresponding to a target program state P5.

Like that shown in FIG. 6A, FIG. 8A shows a 4BL bias zone 808, a 3BL bias zone 810, an enabled bias zone 812, and an inhibit zone 806 associated with the target program state P3. For example, assuming that a memory cell is configured to be programmed into the target program state P3. If a Vth of the memory cell is in 4BL bias zone 808, then the Vth of the memory cell is equal to or greater than a first bias verify voltage $V_{verify\_4BL\_P3}$ associated with the target program state P3 and smaller than the verify voltage $V_{verify\_P3}$ of the target program state P3. If the Vth of the memory cell is in 3BL bias zone 810, then the Vth of the memory cell is equal to or greater than a second bias verify voltage $V_{verify\_3BL\_P3}$ associated with the target program state P3 and smaller than the first bias verify voltage $V_{verify\_4BL\_P3}$ associated with the target program state P3. If the Vth of the memory cell is in enabled bias zone 812, then the Vth of the memory cell is smaller than the second bias verify voltage $V_{verify\_3BL\_P3}$ associated with the target program state P3. If the Vth of the memory cell is in inhibit zone 806, then the Vth of the memory cell is equal to or greater than the verify voltage $V_{verify\_P3}$ of the target program state P3.

FIG. 8A also shows a 4BL bias zone 818, a 3BL bias zone 820, an enabled bias zone 822, and an inhibit zone 816 associated with the target program state P4. For example, assuming that a memory cell is configured to be programmed into the target program state P4. If a Vth of the memory cell is in 4BL bias zone 818, then the Vth of the memory cell is equal to or greater than a first bias verify voltage $V_{verify\_4BL\_P4}$ associated with the target program state P4 and smaller than the verify voltage $V_{verify\_P4}$ of the target program state P4. If the Vth of the memory cell is in 3BL bias zone 820, then the Vth of the memory cell is equal to or greater than a second bias verify voltage $V_{verify\_3BL\_P4}$ associated with the target program state P4 and smaller than the first bias verify voltage $V_{verify\_4BL\_P4}$ associated with the target program state P4. If the Vth of the memory cell is in enabled bias zone 822, then the Vth of the memory cell is smaller than the second bias verify voltage $V_{verify\_3BL\_P4}$ associated with the target program state P4. If the Vth of the memory cell is in inhibit zone 806, then the Vth of the memory cell is equal to or greater than the verify voltage $V_{verify\_P4}$ of the target program state P4.

Figure 8C:
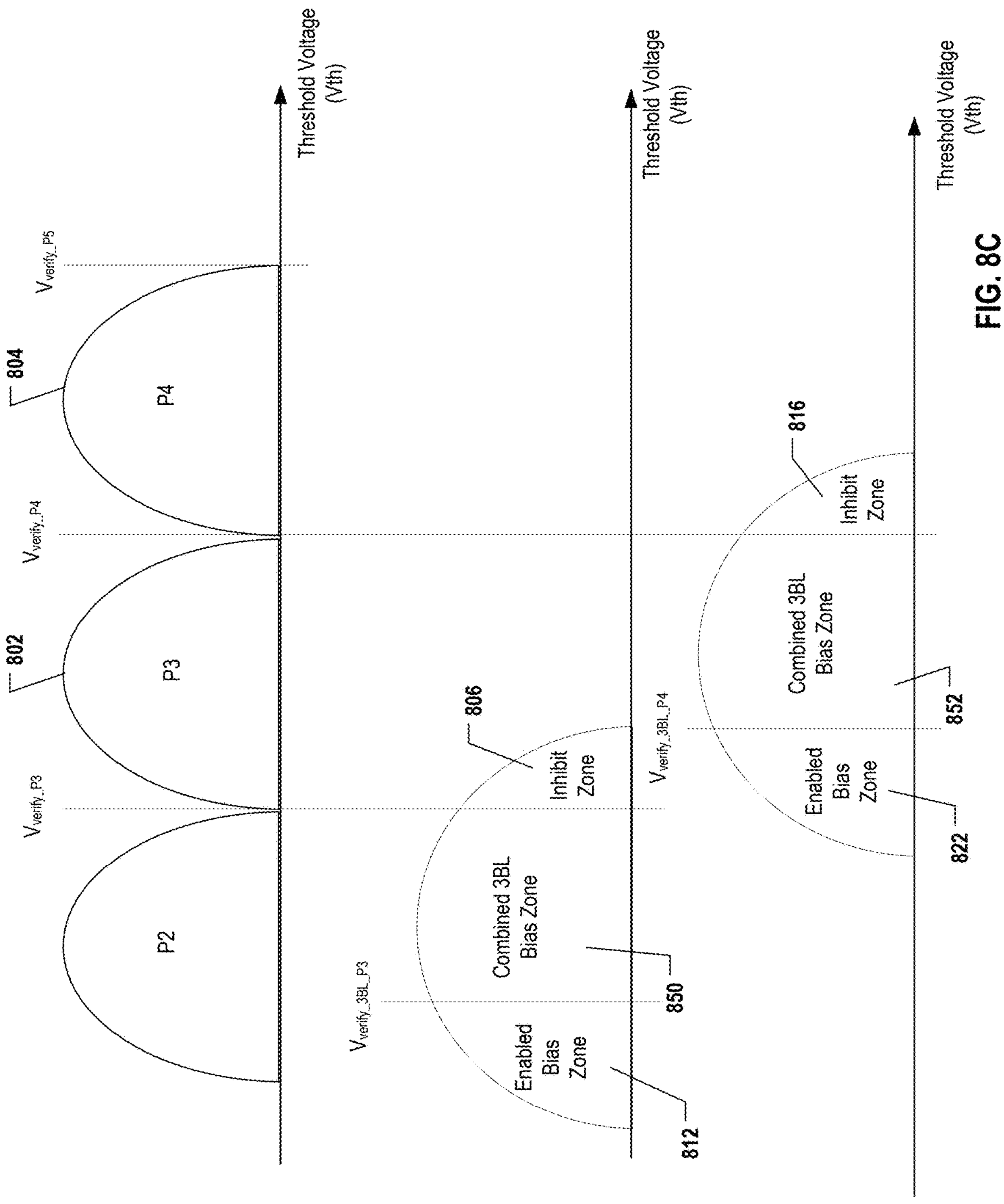
FIG. 8C illustrates a second example of a waveform of word line voltages applied to a word line and waveforms of bit line voltages applied to bit lines, according to some aspects of the present disclosure.

In some other implementations, each target program state may be associated with a combined 3BL bias zone, an enabled bias zone, and an inhibit zone, like that shown in FIG. 6C or in FIG. 8C. For example, with reference to FIG. 8C, 4BL bias zone 808 and 3BL bias zone 810 of FIG. 8A may be combined to form a combined 3BL bias zone 850. If a Vth of a memory cell configured to be programmed into the target program state P3 is in combined 3BL bias zone 850, then the Vth of the memory cell is equal to or greater than the second bias verify voltage $V_{verify\_3BL\_P3}$ associated with the target program state P3 and smaller than the verify voltage $V_{verify\_P3}$ of the target program state P3. Similarly, 4BL bias zone 818 and 3BL bias zone 820 of FIG. 8A may be combined to form a combined 3BL bias zone 852 in FIG. 8C. If a Vth of a memory cell configured to be programmed into the target program state P4 is in combined 3BL bias zone 852, then the Vth of the memory cell is equal to or greater than the second bias verify voltage $V_{verify\_3BL\_P4}$ associated with the target program state P4 and smaller than the verify voltage $V_{verify\_P4}$ of the target program state P4.

Method 700 may proceed to operation 704, in which the programming of the subset of the memory cells may be verified to generate a verify result. The subset of the memory cells may include first memory cells which are classified into two or more memory-cell groups based on the verify result. The two or more memory-cell groups are coupled to two or more groups of bit lines, respectively. For example, memory cells in each memory-cell group are coupled to bit lines in a corresponding group of bit lines, respectively. In some implementations, the two or more memory-cell groups may include (i) a first memory-cell group including at least a second memory cell, and (ii) a second memory-cell group including at least a third memory cell. The first memory-cell group and the second memory-cell group are described below in more detail. Each of the second memory cell and the third memory cell is a memory cell from the first memory cells.

In some implementations, the programming of the subset of the memory cells can be verified to generate a verify result. The verify result may indicate that the subset of the memory cells may include: (i) the first memory cells having Vths smaller than their respective target Vths; and (ii) one or more fourth memory cells each having a Vth equal to or greater than a target Vth of the respective fourth memory cell. The one or more fourth memory cells may form a program-inhibit memory-cell group.

In some implementations, corresponding to that each target program state may be associated with a 4BL bias zone, a 3BL bias zone, an enabled bias zone, and an inhibit zone, as shown in FIG. 8A, the first memory cells may be divided into the first memory-cell group (including the second memory cell), the second memory-cell group (including the third memory cell), and a third memory-cell group (including at least a fifth memory cell). A Vth of the second memory cell is equal to or greater than a first bias verify voltage (e.g., $V_{verify\_4BL}$) corresponding to a target program state of the second memory cell but smaller than a target Vth of the second memory cell. A Vth of the third memory cell is smaller than a first bias verify voltage (e.g., V verify 4BL) corresponding to a target program state of the third memory cell and equal to or greater than a second bias verify voltage (e.g., $V_{verify\_3BL}$) corresponding to the target program state of the third memory cell. A Vth of the fifth memory cell is smaller than a second bias verify voltage (e.g., $V_{verify\_3BL}$) corresponding to a target program state of the fifth memory cell. As a result, a first Vth difference between the Vth and the target Vth of the second memory cell is smaller than a second Vth difference between the Vth and the target Vth of the third memory cell. The second Vth difference between the Vth and the target Vth of the third memory cell is smaller than a third Vth difference between the Vth and the target Vth of the fifth memory cell. For example, the Vth of the second memory cell is in a 4BL bias zone, the Vth of the third memory cell is in a 3BL bias zone, and the Vth of the fifth memory cell is in an enabled bias zone.

For example, with reference to FIG. 8A, if the target program state of the second memory cell is P3, then the Vth of the second memory cell is in 4BL bias zone 808 corresponding to the target program state P3. Alternatively, if the target program state of the second memory cell is P4, then the Vth of the second memory cell is in 4BL bias zone 818 corresponding to the target program state P4. Similarly, if the target program state of the third memory cell is P3, then the Vth of the third memory cell is in 3BL bias zone 810 corresponding to the target program state P3. Alternatively, if the target program state of the third memory cell is P4, then the Vth of the third memory cell is in 3BL bias zone 820 corresponding to the target program state P4. Similarly, if the target program state of the fourth memory cell is P3, then the Vth of the fourth memory cell is in inhibit zone 806 corresponding to the target program state P3. Alternatively, if the target program state of the fourth memory cell is P4, then the Vth of the fourth memory cell is in inhibit zone 816 corresponding to the target program state P4. Similarly, if the target program state of the fifth memory cell is P3, then the Vth of the fifth memory cell is in enabled bias zone 812 corresponding to the target program state P3. Alternatively, if the target program state of the fifth memory cell is P4, then the Vth of the fifth memory cell is in enabled bias zone 822 corresponding to the target program state P4. In some examples, the second memory cell can be referred to as a 4BL memory cell. The third memory cell can be referred to as a 3BL memory cell. The fourth memory cell can be referred to as a program-inhibit memory cell. The fifth memory cell can be referred to as a program-enabled memory cell.

In some other implementations, corresponding to that each target program state may be associated with a combined 3BL bias zone, an enabled bias zone, and an inhibit zone as shown in FIG. 8C, the first memory cells may be divided into: (1) a combined memory-cell group, which includes the first memory-cell group (including the second memory cell) and the second memory-cell group (including the third memory cell); and (2) the third memory-cell group (including at least the fifth memory cell). A memory cell in the combined memory-cell group (e.g., the second memory cell or the third memory cell) can be referred to as a combined 3BL memory cell. A Vth of the memory cell in the combined memory-cell group is equal to or greater than the second bias verify voltage ($V_{verify\_3BL}$) corresponding to a target program state of the memory cell but smaller than a target Vth of the memory cell. A Vth difference between the Vth and the target Vth of the memory cell in the combined memory-cell group is smaller than a Vth difference between the Vth and the target Vth of the fifth memory cell. For example, the Vth of the memory cell in the combined memory-cell group is in a combined 3BL bias zone, and the Vth of the fifth memory cell in the third memory-cell group is in an enabled bias zone.

Referring back to FIG. 7, method 700 may proceed to operation 706, in which the first memory cells may be programmed at least by applying a second program voltage to the word line and applying a program-enabled bias voltage to the two or more groups of bit lines in two or more different time durations, respectively. For each different memory-cell group coupled to a respective group of bit lines, a respective time duration for the respective group of bit lines is different. The respective time duration includes a period of time between a respective bias start time when the program-enabled bias voltage starts to be applied to the respective group of bit lines and a second termination time t_pgm_termination when the second program voltage terminates to be applied to the word line.

Figure 8D:
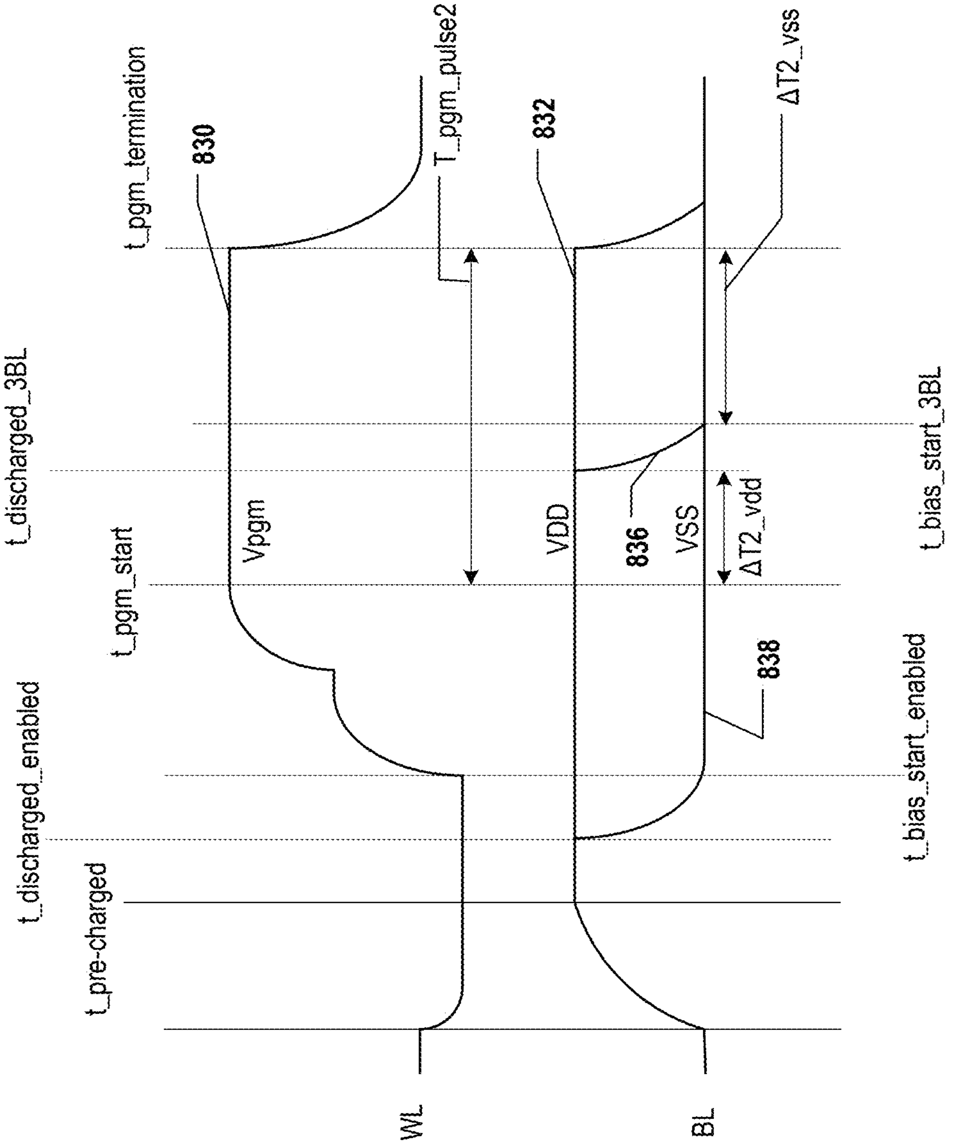
FIG. 8D illustrates a second example of different bias zones for one or more target program states, according to some aspects of the present disclosure.

In some implementations with reference to FIG. 8B or FIG. 8D, to program the first memory cells, the second program voltage may be applied to the word line in a second program window T_pgm_pulse2 from a second program-voltage start time t_pgm_start to the second termination time t_pgm_termination, as shown in a waveform 830 of FIG. 8B or FIG. 8D. The second program-voltage start time t_pgm_start may be a time when the second program voltage starts to be applied to the word line. The second termination time t_pgm_termination may be a time when the second program voltage stops to be applied to the word line.

With respect to the two or more memory-cell groups coupled to the two or more groups of bit lines, respectively, each group of bit lines may be initially pre-charged to a program-inhibit bias voltage (e.g., VDD) before the program-voltage start time t_pgm_start, and discharged at a respective discharged time to arrive at a program-enabled bias voltage (e.g., VSS) at a respective bias start time. The respective discharged time may be a time when the group of bit lines start to be discharged. The respective bias start time may be a time when the program-enabled bias voltage starts to be applied to the group of bit lines. An effective program duration for the corresponding memory-cell group coupled to the group of bit lines may be a time duration between the respective bias start time and the second termination time t_pgm_termination.

In some implementations, corresponding to that each target program state may be associated with a 4BL bias zone, a 3BL bias zone, an enabled bias zone, and an inhibit zone as shown in FIG. 8A, an effective program duration of the first memory-cell group (including the second memory cell having a Vth in a 4BL bias zone) is shorter than an effective program duration of the second memory-cell group (including the third memory cell having a Vth in a 3BL bias zone). The effective program duration of the second memory-cell group is shorter than an effective program duration of the third memory-cell group (including the fifth memory cell having a Vth in an enabled bias zone).

For example, as shown in a waveform 834 of FIG. 8B, a first group of bit lines coupled to the first memory-cell group are pre-charged to the program-inhibit voltage VDD at a pre-charged time t_pre-charged. Next, the first group of bit lines are discharged at a first discharged time t_discharged_4BL to arrive at the program-enabled bias voltage VSS at a first bias start time t_bias_start_4BL. The first bias start time t_bias_start_4BL is a time when the program-enabled bias voltage VSS starts to be applied to the first group of bit lines corresponding to the first memory-cell group. Then, an effective program duration for the first memory-cell group may be a time duration $\Delta T\mathbf{1}\_vss$ between the first bias start time t_bias_start_4BL and the second termination time t_pgm_termination (e.g., $\Delta T\mathbf{1}\_vss$=t_pgm_termination-t_bias_start_4BL). The first bias start time t_bias_start_4BL is between the program-voltage start time t_pgm_start and the second termination time t_pgm_termination. Within the second program window T_pgm_pulse2, a time duration that the first group of bit lines hold the program-inhibit voltage VDD is $\Delta T\mathbf{1}\_vdd$. If a time duration from the first discharged time t_discharged_4BL to the first bias start time t_bias_start_4BL is negligible, then the effective program duration for the first memory-cell group can also be expressed as: the effective program duration≈T_pgm_pulse2−$\Delta T\mathbf{1}\_vdd$.

In another example, as shown in a waveform 836 of FIG. 8B, a second group of bit lines coupled to the second memory-cell group are pre-charged to the program-inhibit voltage VDD at the pre-charged time t_pre-charged. Next, the second group of bit lines are discharged at a second discharged time t_discharged_3BL to arrive at the program-enabled bias voltage VSS at a second bias start time t_bias_start_3BL. The second bias start time t_bias_start_3BL is a time when the program-enabled bias voltage VSS starts to be applied to the second group of bit lines corresponding to the second memory-cell group. Then, an effective program duration for the second memory-cell group may be a time duration $\Delta T\mathbf{2}\_vss$ between the second bias start time t_bias_start_3BL and the second termination time t_pgm_termination (e.g., $\Delta T\mathbf{2}\_vss$=t_pgm_termination-t_bias_start_3BL). The second bias start time t_bias_start_3BL is also between the program-voltage start time t_pgm_start and the second termination time t_pgm_termination. Within the second program window T_pgm_pulse2, a time duration that the second group of bit lines hold the program-inhibit voltage VDD is $\Delta T\mathbf{2}\_vdd$. If a time duration from the second discharged time t_discharged_3BL to the second bias start time t_bias_start_3BL is negligible, then the effective program duration for the second memory-cell group can also be expressed as: the effective program duration≈T_pgm_pulse2−$\Delta T\mathbf{2}\_vdd$.

In still another example, as shown in a waveform 838 of FIG. 8B, a third group of bit lines coupled to the third memory-cell group are pre-charged to the program-inhibit voltage VDD at the pre-charged time t_pre-charged. Next, the third group of bit lines are discharged at a third discharged time t_discharged_enabled to arrive at the program-enabled bias voltage VSS at a third bias start time t_bias_start_enabled before the program-voltage start time t_pgm_start. The third bias start time t_bias_start_enabled is a time when the program-enabled bias voltage VSS starts to be applied to the third group of bit lines corresponding to the third memory-cell group. Since the third group of bit lines hold the program-enabled bias voltage VSS during the entire second program window T_pgm_pulse2, an effective program duration for the third memory-cell group is the entire second program window T_pgm_pulse2.

In yet another example, as shown in a waveform 832 of FIG. 8B, a fourth group of bit lines coupled to the program-inhibit memory-cell group are pre-charged to the program-inhibit voltage VDD at the pre-charged time t_pre-charged. The fourth group of bit lines hold the program-inhibit voltage VDD until the second termination time t_pgm_termination. That is, the fourth group of bit lines are discharged at the second termination time t_pgm_termination. Since the fourth group of bit lines hold the program-inhibit voltage VDD during the entire second program window T_pgm_pulse2, an effective program duration for the program-inhibit memory-cell group is zero.

From the above discussion of FIG. 8B, the effective program duration of the third memory-cell group is greater than the effective program duration of the second memory-cell group. The effective program duration of the second memory-cell group is greater than the effective program duration of the first memory-cell group. The effective program duration of the program-inhibit memory-cell group is zero. As a result, Vth shift step sizes of the third memory-cell group are greater than Vth shift step sizes of the second memory-cell group. The Vth shift step sizes of the second memory-cell group are greater than Vth shift step sizes of the first memory-cell group. Vth shift step sizes of the program-inhibit memory-cell group are zeros. By controlling the discharged times of the different memory-cell groups, the effective program durations of the different memory-cell groups can be controlled so that the Vth shift step sizes of the different memory-cell groups can also be controlled.

In some other implementations, corresponding to that each target program state may be associated with a combined 3BL bias zone, an enabled bias zone, and an inhibit zone as shown in FIG. 8C, an effective program duration of the combined memory-cell group is shorter than an effective program duration of the third memory-cell group (including the fifth memory cell having a Vth in an enabled bias zone) as illustrated in FIG. 8D. For example, as shown in waveform 836 of FIG. 8D, a combined group of bit lines coupled to the combined memory-cell group are pre-charged to the program-inhibit voltage VDD at the pre-charged time t_pre-charged. The combined group of bit lines may include the first group of bit lines coupled to the first memory-cell group and the second group of bit lines coupled to the second memory-cell group. Next, the combined group of bit lines are discharged at the second discharged time t_discharged_3BL to arrive at the program-enabled bias voltage VSS at the second bias start time t_bias_start_3BL. Then, an effective program duration for the combined memory-cell group may be the time duration ΔT2_*vss* between the second bias start time t_bias_start_3BL and the second termination time t_pgm_termination. Within the second program window T_pgm_pulse2, a time duration that the combined group of bit lines hold the program-inhibit voltage VDD is ΔT2_*vdd*. If a time duration from the second discharged time t_discharged_3BL to the second bias start time t_bias_start_3BL is negligible, then the effective program duration for the combined memory-cell group can also be expressed as: the effective program duration≈T_pgm_pulse2−ΔT2_*vdd*.

In FIG. 8D, the effective program duration of the third memory-cell group can be determined to be the program window T_pgm_pulse2, like that described above with reference to FIG. 8B. The effective program duration of the third memory-cell group is greater than the effective program duration of the combined memory-cell group. The effective program duration of the program-inhibit memory-cell group is zero. As a result, Vth shift step sizes of the third memory-cell group are greater than Vth shift step sizes of the combined memory-cell group. Vth shift step sizes of the program-inhibit memory-cell group are zeros. Thus, by controlling the discharged times of the different memory-cell groups, the effective program durations of the different memory-cell groups can be controlled so that the Vth shift step sizes of the different memory-cell groups can also be controlled.

It is contemplated that in some implementations, the bit line bias scheme described above with reference to FIGS. 6A-6D and the shift control scheme disclosed herein with reference to FIGS. 8A-8D can be implemented together. For example, to perform a program operation on a set of memory cells, the shift control scheme disclosed herein can be applied firstly to program the set of memory cells, followed by an application of the bit line bias scheme to continue programming the remaining memory cells which are not programmed into their respective target program states yet. Alternatively, the bit line bias scheme can be applied firstly to program the set of memory cells, followed by an application of the shift control scheme disclosed herein to continue programming the remaining memory cells that are not programmed into their respective target program states yet.

A comparison of the bit line bias scheme and the shift control scheme disclosed herein is provided from four example aspects below. In a first example aspect, the design of a page buffer for the bit line bias scheme is more complicated than that of the shift control scheme disclosed herein. The chip area of the page buffer for the bit line bias scheme is larger than that of the shift control scheme disclosed herein. For example, in the bit line bias scheme, bit lines are pre-charged to different bias voltages such as VDD, V3*bl*, and V4*bl* as shown in FIG. 6B, which may increase the design complexity of the page buffer. Different charging circuit paths are needed to pre-charge the bit lines to the different bias voltages, which may increase the chip area of the page buffer. On the other hand, in the shift control scheme disclosed herein, the bit lines are pre-charged to the program-inhibit bias voltage VDD only, and discharged from VDD at different discharged times so that the effective program durations of different memory cells can be controlled. The design complexity and the chip area of the page buffer can be reduced in the shift control scheme disclosed herein.

In a second example aspect, the control of the Vth shift step sizes in the shift control scheme disclosed herein is more stable than that of the bit line bias scheme. A modeling of a tunneling charge ΔQ using $\Delta Q \propto \Delta V \cdot T$ can be performed to analyze the stability of the control of the Vth shift step sizes. ΔV represents a voltage difference, and T represents a time duration of the voltage difference ΔV. With respect to the bit line bias scheme, if (1) the bit line bias scheme is already applied when a first program pulse is applied to program a memory cell and (2) the programming of the memory cell fails in the verify phase, then one or more subsequent program pulses can be applied to continue programming the memory cell. A Vth shift step size related to the one or more subsequent program pulses is restored to be $\Delta Q \propto \Delta V \cdot T \propto ISPP \cdot T\_pgm\_pulse$, which is uncorrelated to the bias voltages applied to the bit line. ΔV=ISPP, and ISPP represents a step size between two adjacent program pulses when ISPP is applied. T=T_pgm_pulse, and T_pgm_pulse represents a time duration of each program pulse. That is, the application of the different bias voltages to the bit line cannot be used to control the Vth shift step size of the memory cell during the programming of the one or more subsequent program pulses.

With respect to the shift control scheme disclosed herein, if (1) the shift control scheme is already applied when a first program pulse is applied to program a memory cell and (2) the programming of the memory cell fails in the verify phase, then one or more subsequent program pulses can be applied to continue programming the memory cell. A Vth shift step size related to the one or more subsequent program pulses remains to be ΔQ∝ΔV·T∝ISPP·(T_pgm_pulse−ΔT_vdd), which can still be controlled by the time duration ΔT_vdd during which the bit line holds the program-inhibit bias voltage VDD. As a result, the control of the Vth shift step size by applying the shift control scheme is still applicable for the one or more subsequent program pulses.

In a third example aspect, the adjustment accuracy of the Vth shift step size in the shift control scheme disclosed herein is higher than that of the bit line bias scheme. The modeling of the tunneling charge ΔQ using ΔQ∝ΔV·T can be performed to analyze the adjustment accuracy of the Vth shift step size. With respect to the bit line bias scheme, ΔQ=k·ΔVbl·T_pgm_pulse. With respect to the shift control scheme disclosed herein, ΔQ=k·ISPP·ΔT. In some example designs, T_pgm_pulse=6.4 us, ΔVbl=0.025V, ISPP=0.2V, and ΔT=20 ns. The adjustment accuracy of the shift control scheme disclosed herein is about 40 times higher than that of the bit line bias scheme.

In a fourth example aspect, a window of a DSG select voltage (vTSG) in the shift control scheme disclosed herein is wider than that of the bit line bias scheme. For example, the window of the DSG select voltage in the shift control scheme disclosed herein is vTSG∈[0+Vt_max_tsg, VDD+Vt_min_tsg], whereas the window of the DSG select voltage in the 3BL bias scheme is vTSG∈[V3*bl*+Vt_max_tsg, VDD+Vt_min_tsg] and the window of the DSG select voltage in the 4BL bias scheme is vTSG∈[V4*bl*+Vt_max_tsg, VDD+Vt_min_tsg].

Figure 9A:
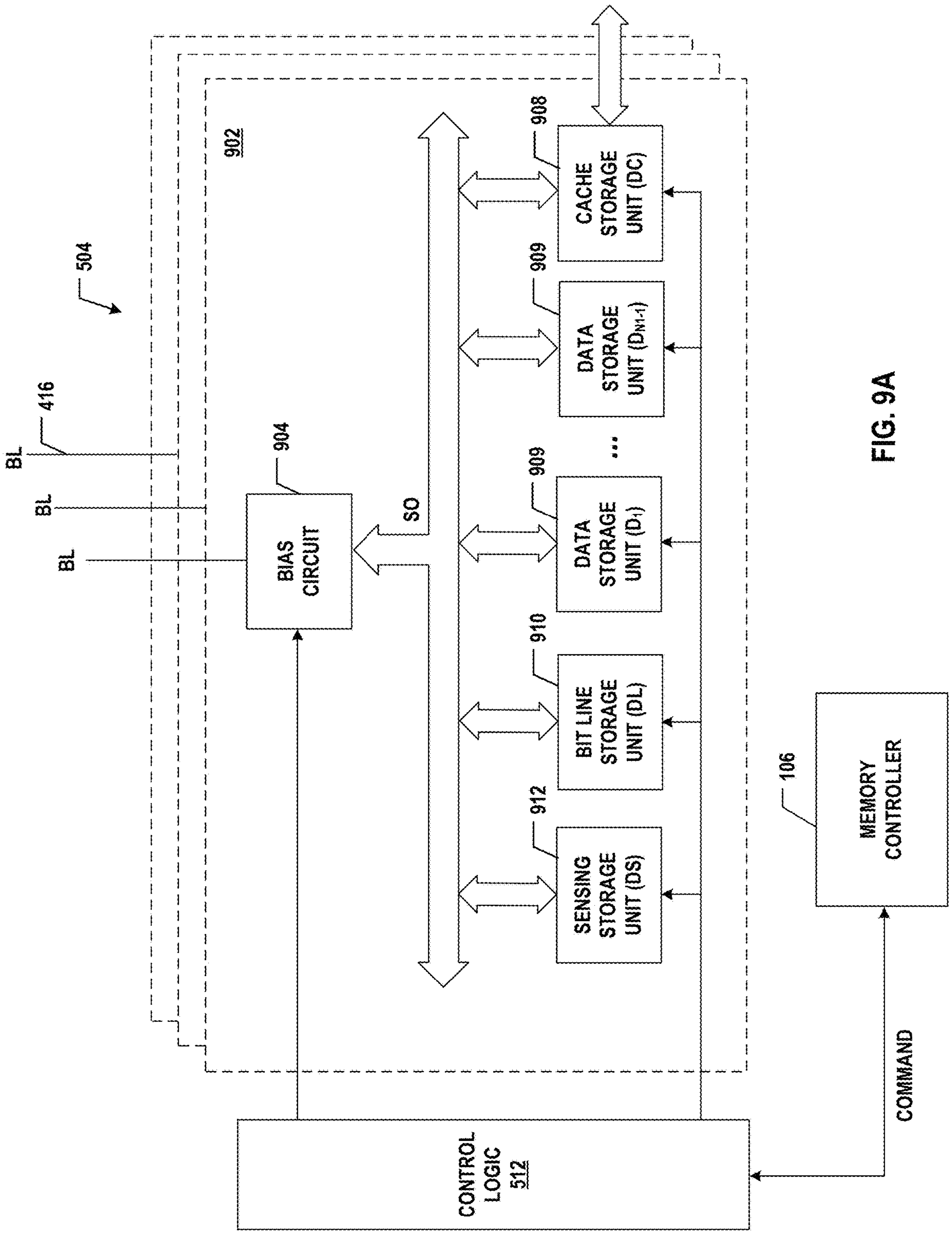
FIG. 9A illustrates a detailed block diagram of an example structure of a page buffer, according to some aspects of the present disclosure.

FIG. 9A illustrates a detailed block diagram of an example structure of a page buffer (e.g., page buffer/sense amplifier 504), according to some aspects of the present disclosure. In some implementations, the page buffer in FIG. 9A includes a plurality of page buffer circuits 902 each coupled to a respective one of bit lines 416. In other words, each page buffer circuit 902 can be coupled to a respective column of memory cells (e.g., NAND memory string 408) through a corresponding bit line 416 and configured to temporarily store a set of N-bits data that is used for programming a respective select memory cell 406 (coupled to select word line 418 and the corresponding bit line 416) in a program operation. For example, for MLCs where N=2, each page buffer circuit 902 may be configured to temporarily store a set of 2-bits data (e.g., one of 00, 01, 10, and 11). In some implementations, each page buffer circuit 902 can include a plurality of storage units and a bias circuit 904. The plurality of storage units may include Nl−1 data storage units ($D_1$, . . . , $D_{Nl-1}$) 909, a cache storage unit (DC) 908, a bias level storage unit (DL) 910, and a sensing storage unit (DS) 912.

Figure 9B:
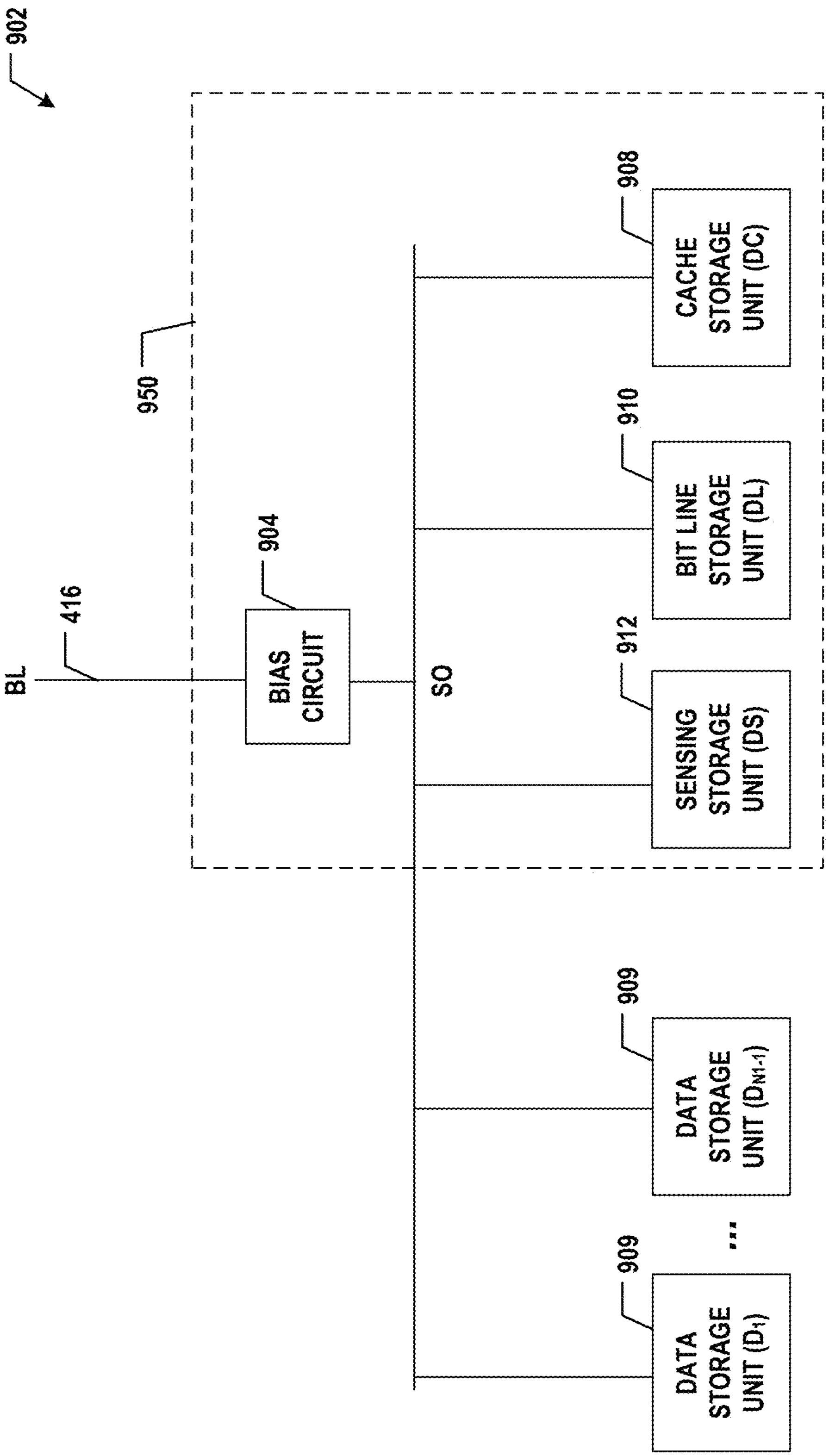
FIG. 9B illustrates a detailed block diagram of an example structure of a page buffer circuit, according to some aspects of the present disclosure.

FIG. 9B illustrates a detailed block diagram of an example structure of a page buffer circuit (e.g., page buffer circuit 902), according to some aspects of the present disclosure. In FIG. 9B, an output of bias circuit 904 is coupled to a sense out (SO) node. N−1 data storage units 909, cache storage unit 908, sensing storage unit 912, and bias level storage unit 910 are coupled to the SO node, respectively. A portion 950 of page buffer circuit 902 in FIG. 6B (including bias circuit 904, sensing storage unit 912, bias level storage unit 910, and cache storage unit 908) is illustrated below in more detail with reference to FIG. 9C. In some implementations, each of N−1 data storage units 909 may have a structure like that of sensing storage unit 912, bias level storage unit 910, or cache storage unit 908. Thus, the structures of N−1 data storage units 909 are not shown in FIG. 9C.

Figure 9C:
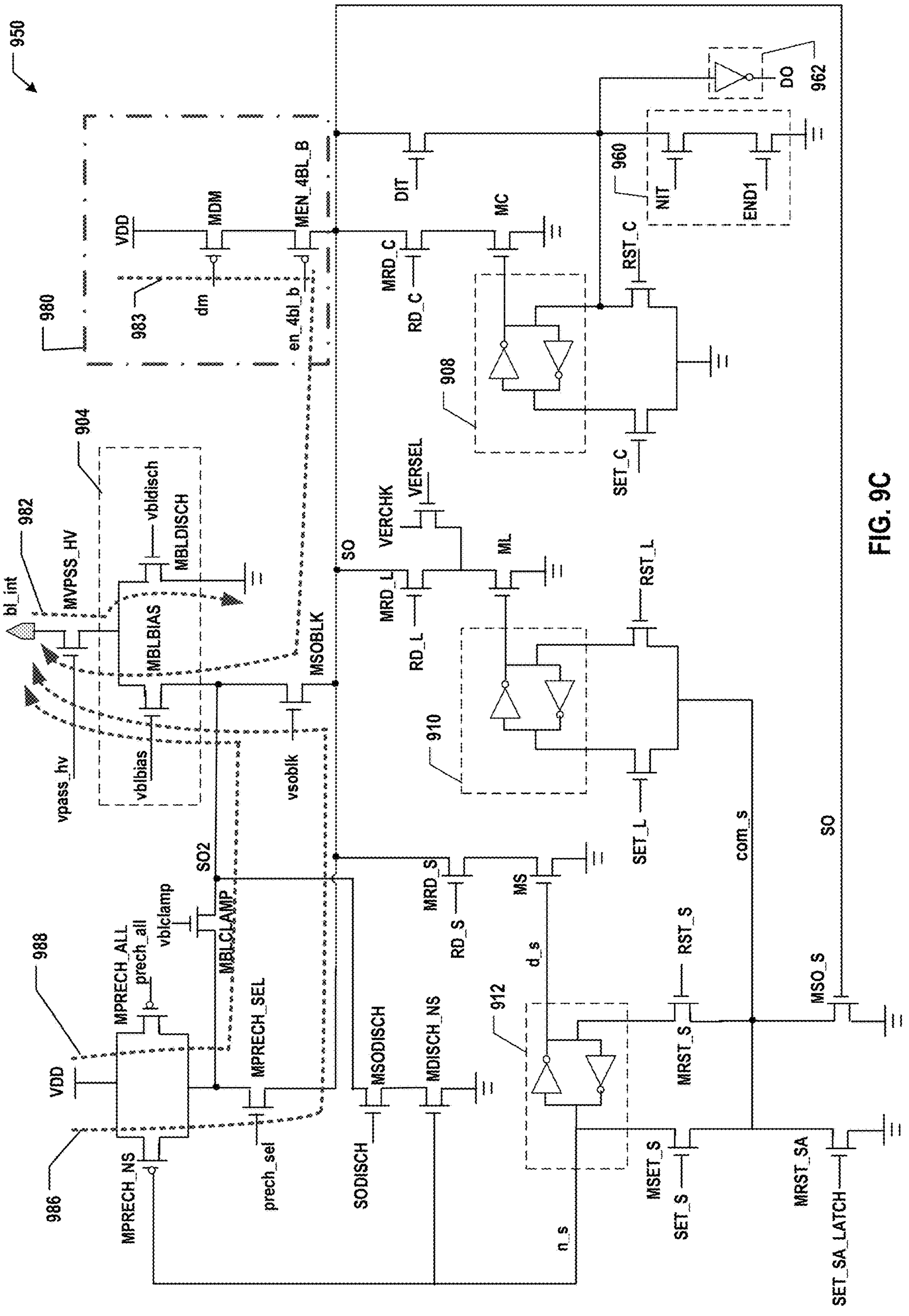
FIG. 9C illustrates a circuit diagram of a portion of the page buffer circuit in FIG. 9B, according to some aspects of the present disclosure.

FIG. 9C illustrates a circuit diagram of a portion (e.g., portion 950) of page buffer circuit 902, according to some aspects of the present disclosure. Example circuit structures of sensing storage unit 912, bias level storage unit 910, cache storage unit 908, and bias circuit 904 are illustrated in FIG. 9C. Portion 950 of page buffer circuit 902 shown in FIG. 9C may also include an input circuit 960 and a data-out (DO) buffer 962. Input circuit 960 may be configured to receive programming data that is intended to be programmed into the memory device. For example, during a program operation, the programming data from interface 516 can be inputted into cache storage unit 908 via input circuit 960. For a read operation, a sensing result stored in cache storage unit 908 can be outputted to interface 516 through data-out buffer 962.

Page buffer circuit 902 can be used to implement the bias bit line scheme. For example, a charging circuit path 986 can be used to pre-charge a bit line (e.g., bl_int shown in FIG. 9C) to the program-inhibit bias voltage VDD. A charging circuit path 983 can be used to pre-charge the bit line to the 4BL bias voltage V4*bl*. A charging circuit path 988 can be used to pre-charge the bit line to the 3BL bias voltage V3*bl*. A discharging circuit path 982 can be used to discharge the bit line to the program-enabled bias voltage VSS. Charging circuit paths 986, 983, 988, and discharging circuit path 982 are illustrated using dotted lines in FIG. 9C. By turning on transistors MPRECH_NS, MPRECH_SEL, MSOBLK, MBLBIAS, and MVPSS_HV in charging circuit path 986, the bit line coupled to page buffer circuit 902 can be pre-charged to the program-inhibit bias voltage VDD. By turning on transistors MPRECH_ALL, MBLCLAMP, MBLBIAS, and MVPSS_HV in charging circuit path 988, the bit line can be pre-charged to the 3BL bias voltage V3*bl*. By turning on transistors MDM, MEN_4BL_B, MSOBLK, MBLBIAS, and MVPSS_HV in charging circuit path 983, the bit line coupled to page buffer circuit 902 can be pre-charged to the 4BL bias voltage V4*bl*. By turning on transistors MVPSS_HV and MBLDISCH, the bit line can be discharged to the program-enabled bias voltage VSS.

Page buffer circuit 902 can also be used to implement the shift control scheme disclosed herein. For example, charging circuit path 986 can be used to pre-charge the bit line to the program-inhibit bias voltage VDD, and discharging circuit path 982 can be used to discharge the bit line to the program-enabled bias voltage VSS. Since there is no need to pre-charge the bit line to the 4BL bias voltage V4*bl* in the shift control scheme disclosed herein, a portion of the circuits in charging circuit path 983 (e.g., circuits illustrated within a dash-dot box 980) can be omitted to reduce the chip area of page buffer circuit 902.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:

a memory cell array comprising memory cells; and a peripheral circuit coupled to the memory cell array, and configured to:

program at least a subset of the memory cells at least by applying a first program voltage to a word line coupled to the subset of the memory cells;

verify the programming of the subset of the memory cells to generate a verify result, wherein the subset of the memory cells comprise first memory cells that are classified into two or more memory-cell groups based on the verify result, and wherein the two or more memory-cell groups are coupled to two or more groups of bit lines, respectively; and program the first memory cells by:

applying a second program voltage to the word line from a program-voltage start time to a termination time; and for each group of bit lines coupled to a respective memory-cell group, pre-charging the respective group of bit lines to a program-inhibit bias voltage before the program-voltage start time:

discharging the respective group of bit lines to arrive at a program-enabled bias voltage at a respective bias start time associated with the respective memory-cell group; and applying the program-enabled bias voltage to the respective group of bit lines from the respective bias start time to the termination time.

2. The memory device of claim 1, wherein for each different group of bit lines, a respective time duration when the program-enabled bias voltage is applied to the respective group of bit lines is different, and wherein the respective time duration comprises a period of time between the respective bias start time when the program-enabled bias voltage starts to be applied to the respective group of bit lines and the termination time when the second program voltage terminates to be applied to the word line.

3. The memory device of claim 2, wherein:

the two or more memory-cell groups comprise a first memory-cell group comprising a second memory cell and a second memory-cell group comprising a third memory cell;

a first threshold voltage (Vth) difference between a Vth of the second memory cell and a target Vth of the second memory cell is smaller than a second Vth difference between a Vth of the third memory cell and a target Vth of the third memory cell; and a first time duration between a first bias start time and the termination time is smaller than a second time duration between a second bias start time and the termination time, wherein the first bias start time is a time when the program-enabled bias voltage starts to be applied to a first group of bit lines coupled to the first memory-cell group, and the second bias start time is a time when the program-enabled bias voltage starts to be applied to a second group of bit lines coupled to the second memory-cell group.

4. The memory device of claim 3, wherein:

the Vth of the second memory cell is equal to or greater than a first bias verify voltage corresponding to a target program state of the second memory cell but smaller than the target Vth of the second memory cell; and the Vth of the third memory cell is smaller than a first bias verify voltage corresponding to a target program state of the third memory cell and equal to or greater than a second bias verify voltage corresponding to the target program state of the third memory cell.

5. The memory device of claim 2, wherein:

the memory cells further comprise a fourth memory cell, wherein a threshold voltage (Vth) of the fourth memory cell is equal to or greater than a target Vth of the fourth memory cell; and to program the first memory cells, the peripheral circuit is further configured to:

apply the program-inhibit bias voltage to a bit line coupled to the fourth memory cell from the program-voltage start time to the termination time.

6. The memory device of claim 1, wherein the memory device comprises a NAND Flash memory device.

7. A method of operating a memory device, comprising:

programming at least a subset of memory cells in the memory device at least by applying a first program voltage to a word line coupled to the subset of the memory cells;

verifying the programming of the subset of the memory cells to generate a verify result, wherein the subset of the memory cells comprise first memory cells that are classified into two or more memory-cell groups based on the verify result, and wherein the two or more memory-cell groups are coupled to two or more groups of bit lines, respectively; and programming the first memory cells by:

applying a second program voltage to the word line from a program-voltage start time to a termination time; and for each group of bit lines coupled to a respective memory-cell group, pre-charging the respective group of bit lines to a program-inhibit bias voltage before the program-voltage start time;

discharging the respective group of bit lines to arrive at a program-enabled bias voltage at a respective bias start time associated with the respective memory-cell group; and applying the program-enabled bias voltage to the respective group of bit lines from the respective bias start time to the termination time.

8. The method of claim 7, wherein for each different group of bit lines, a respective time duration when the program-enabled bias voltage is applied to the respective group of bit lines is different, and wherein the respective time duration comprises a period of time between the respective bias start time when the program-enabled bias voltage starts to be applied to the respective group of bit lines and the termination time when the second program voltage terminates to be applied to the word line.

9. The method of claim 8, wherein:

the two or more memory-cell groups comprise a first memory-cell group comprising a second memory cell and a second memory-cell group comprising a third memory cell;

a first threshold voltage (Vth) difference between a Vth of the second memory cell and a target Vth of the second memory cell is smaller than a second Vth difference between a Vth of the third memory cell and a target Vth of the third memory cell; and a first time duration between a first bias start time and the termination time is smaller than a second time duration between a second bias start time and the termination time, wherein the first bias start time is a time when the program-enabled bias voltage starts to be applied to a first group of bit lines coupled to the first memory-cell group, and the second bias start time is a time when the program-enabled bias voltage starts to be applied to a second group of bit lines coupled to the second memory-cell group.

10. The method of claim 9, wherein:

the Vth of the second memory cell is equal to or greater than a first bias verify voltage corresponding to a target program state of the second memory cell but smaller than the target Vth of the second memory cell; and the Vth of the third memory cell is smaller than a first bias verify voltage corresponding to a target program state of the third memory cell and equal to or greater than a second bias verify voltage corresponding to the target program state of the third memory cell.

11. The method of claim 8, wherein:

the memory cells further comprise a fourth memory cell, wherein a threshold voltage (Vth) of the fourth memory cell is equal to or greater than a target Vth of the fourth memory cell; and programming the first memory cells further comprises:

applying the program-inhibit bias voltage to a bit line coupled to the fourth memory cell from the program-voltage start time to the termination time.

12. The method of claim 7, wherein the memory device comprises a NAND Flash memory device.

13. A system, comprising:

a memory device, comprising:

a memory cell array comprising memory cells; and a peripheral circuit coupled to the memory cell array, and configured to:

program at least a subset of the memory cells at least by applying a first program voltage to a word line coupled to the subset of the memory cells;

verify the programming of the subset of the memory cells to generate a verify result, wherein the subset of the memory cells comprise first memory cells that are classified into two or more memory-cell groups based on the verify result, and wherein the two or more memory-cell groups are coupled to two or more groups of bit lines, respectively; and program the first memory cells by:

applying a second program voltage to the word line from a program-voltage start time to a termination time; and for each group of bit lines coupled to a respective memory-cell group, pre-charging the respective group of bit lines to a program-inhibit bias voltage before the program-voltage start time;

discharging the respective group of bit lines to arrive at a program-enabled bias voltage at a respective bias start time associated with the respective memory-cell group; and applying the program-enabled bias voltage to the respective group of bit lines from the respective bias start time to the termination time; and a memory controller coupled to the memory device and configured to control an operation of the memory device.

14. The system of claim 13, wherein for each different group of bit lines, a respective time duration when the program-enabled bias voltage is applied to the respective group of bit lines is different, and wherein the respective time duration comprises a period of time between the respective bias start time when the program-enabled bias voltage starts to be applied to the respective group of bit lines and the termination time when the second program voltage terminates to be applied to the word line.

15. The system of claim 14, wherein:

the two or more memory-cell groups comprise a first memory-cell group comprising a second memory cell and a second memory-cell group comprising a third memory cell;

a first threshold voltage (Vth) difference between a Vth of the second memory cell and a target Vth of the second memory cell is smaller than a second Vth difference between a Vth of the third memory cell and a target Vth of the third memory cell; and a first time duration between a first bias start time and the termination time is smaller than a second time duration between a second bias start time and the termination time, wherein the first bias start time is a time when the program-enabled bias voltage starts to be applied to a first group of bit lines coupled to the first memory-cell group, and the second bias start time is a time when the program-enabled bias voltage starts to be applied to a second group of bit lines coupled to the second memory-cell group.

16. The system of claim 15, wherein:

the Vth of the second memory cell is equal to or greater than a first bias verify voltage corresponding to a target program state of the second memory cell but smaller than the target Vth of the second memory cell; and the Vth of the third memory cell is smaller than a first bias verify voltage corresponding to a target program state of the third memory cell and equal to or greater than a second bias verify voltage corresponding to the target program state of the third memory cell.

17. The system of claim 14, wherein the memory cells further comprise a fourth memory cell, wherein a threshold voltage (Vth) of the fourth memory cell is equal to or greater than a target Vth of the fourth memory cell, and to program the first memory cells, the peripheral circuit is further configured to:

apply the program-inhibit bias voltage to a bit line coupled to the fourth memory cell from the program-voltage start time to the termination time.

18. The memory system of claim 13, wherein the memory device comprises a NAND Flash memory device.

19. The memory system of claim 16, wherein the target program state of the second memory cell is identical to or different from the target program state of the third memory cell.

20. The memory device of claim 4, wherein the target program state of the second memory cell is identical to or different from the target program state of the third memory cell.

* * * * *